(12) United States Patent
Ohno

(10) Patent No.: US 7,193,250 B2
(45) Date of Patent: *Mar. 20, 2007

(54) LIGHT-EMITTING ELEMENT HAVING PNPN-STRUCTURE AND LIGHT-EMITTING ELEMENT ARRAY

(75) Inventor: Seiji Ohno, Minato-ku (JP)

(73) Assignee: Nippon Sheet Glass Company, Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/505,698

(22) PCT Filed: Feb. 21, 2003

(86) PCT No.: PCT/JP03/01906

§ 371 (c)(1),
(2), (4) Date: Mar. 29, 2005

(87) PCT Pub. No.: WO03/071609

PCT Pub. Date: Aug. 28, 2003

(65) Prior Publication Data

US 2005/0224810 A1   Oct. 13, 2005

(30) Foreign Application Priority Data

Feb. 25, 2002   (JP)  .............................. 2002-047865

(51) Int. Cl.
*H01L 29/74* (2006.01)

(52) U.S. Cl. ...................... 257/115; 257/157; 257/183; 257/192; 257/194; 257/280; 257/471; 257/477

(58) Field of Classification Search .................... None
See application file for complete search history.

(56) References Cited

U.S. PATENT DOCUMENTS 6,180,960 B1 *   1/2001   Kusuda et al. ................. 257/91
6,507,057 B1 *   1/2003   Ohno .......................... 257/257

FOREIGN PATENT DOCUMENTS

| EP | 0 410 695 A2 | 1/1991 |
| EP | 0 917 212 A1 | 5/1999 |
| JP | 1-238962 | 9/1989 |
| JP | 2-14584 | 1/1990 |
| JP | 2-92650 | 4/1990 |
| JP | 2-92651 | 4/1990 |
| JP | 2-263668 | 10/1990 |
| JP | 2001-326383 | 11/2001 |

* cited by examiner

*Primary Examiner*—Wai-Sing Louie
(74) *Attorney, Agent, or Firm*—RatnerPrestia

(57) ABSTRACT

A light-emitting element including a light-emitting thyristor and a schottky barrier diode is provided. A schottky barrier diode is formed by contacting a metal terminal to a gate layer of a three-terminal light-emitting thyristor consisting of a PNPN-structure. A self-scanning light-emitting element array may be driven at 3.0 V by using such a schottky barrier diode as a coupling diode of a diode-coupled self-scanning light-emitting element array.

7 Claims, 30 Drawing Sheets

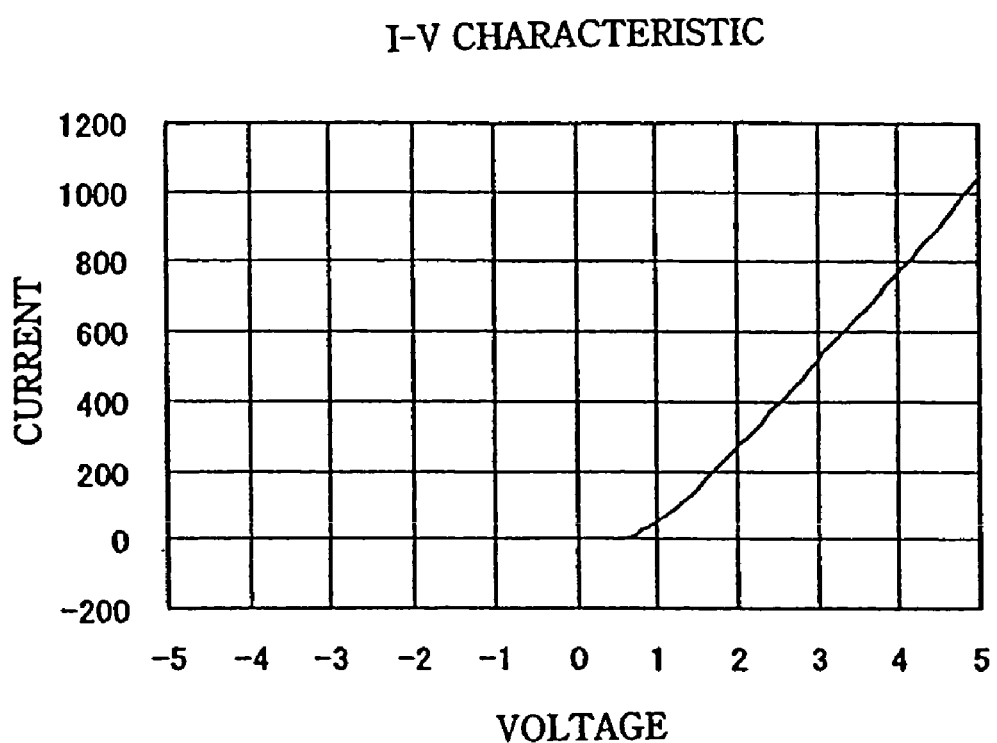

OR-gate

| $D_1$ | $D_2$ | A | S |
|---|---|---|---|
| H | H | * | 0 |
| H | L | | |
| L | H | | |
| L | L | H | 1 |
| | | L | 0 |

AND-gate

| $D_1$ | $D_2$ | K | S |
|---|---|---|---|
| L | L | * | 0 |
| H | L | | |
| L | H | | |
| H | H | H | 0 |
| | | L | 1 |

AND-gate

| $D_1$ | $D_2$ | A | S |
|---|---|---|---|
| H | H | * | 0 |
| H | L | H | 1 |
| L | H | | |
| L | L | | |
| H | L | L | 0 |
| L | H | | |
| L | L | | |

OR-gate

| $D_1$ | $D_2$ | K | S |
|---|---|---|---|
| L | L | * | 0 |
| H | L | L | 1 |
| L | H | | |
| H | H | | |
| H | L | H | 0 |
| L | H | | |
| H | H | | |

| D | A | G | S |
|---|---|---|---|
| H | H | L | 1 |
|   |   | H | 0 |
| H | L |   |   |
| L | H | * | 0 |
| H | H |   |   |

| $D_1$ | $D_2$ | G | S |
|---|---|---|---|
| H | H | L | 1 |
| H | L | | |
| L | H | | |
| H | H | H | 0 |
| H | L | | |
| L | H | | |
| L | L | * | 0 |

| D | K | G | S |
|---|---|---|---|
| L | L | L | 0 |
|   |   | H | 1 |
| H | L |   |   |
| L | H | * | 0 |
| H | H |   |   |

| $D_1$ | $D_2$ | G | S |
|---|---|---|---|
| L | L | | |
| H | L | H | 1 |
| L | H | | |
| L | L | | |
| H | L | L | 0 |
| L | H | | |
| H | H | * | 0 |

LIGHT-EMITTING ELEMENT HAVING PNPN-STRUCTURE AND LIGHT-EMITTING ELEMENT ARRAY

TECHNICAL FIELD

The present invention generally relates to a light-emitting element and light-emitting element array having a PNPN-structure, particularly to a light-emitting element and light-emitting element array having a logical function. The present invention further relates to a light-emitting element array which is operated at 3.0 volts (V).

BACKGROUND ART

A digital circuit has a tendency to decrease its power supply voltage for the requirements of higher speed and lower consumed power. The power supply voltage thereof has been changing from a 5V system to a 3.3V system and further to a lower voltage system. An error of ±10% is allowed for a power supply voltage of 3.3V, therefore a digital circuit should be guaranteed to be operated at 3.0V.

As an example of a digital circuit, a light-emitting element array may be considered. The light-emitting element array in which a number of light-emitting elements are integrated in the same substrate is used for a writing light-source of an optical printer head and the like in conjunction with its driver IC (Integrated Circuit).

The inventor of the present application has interested in a three-terminal light-emitting thyristor having a PNPN-structure as a component of a light-emitting element array, and has already proposed a self-scanning light-emitting element array for realizing a self-scanning function of light-emitting points (see Japanese Patent Publications Nos. 1-238962, 2-14584, 2-92650, and 2-92651). These patent publications have disclosed that self-scanning light-emitting arrays may be easily mounted for a writing light-source of an optical printer, the array pitch of light-emitting elements may be fined, a compact self-scanning light-emitting element array may be fabricated, and so on.

The inventor has also proposed a self-scanning light-emitting element array in which a switch element (a light-emitting thyristor) array is structured as a shift portion and is separated from a light-emitting element (a light-emitting thyristor) array structured as a light-emitting portion (see Japanese Patent Publication No. 2-263668). These proposed self-scanning light-emitting element array is structured so as to be operated by a driver IC of a 5V power supply system.

A power supply voltage for a driver IC has been changed from a 5V system to a 3.3V system as described above, because the consumed power therein may be reduced by decreasing a power supply voltage. Consequently, the light-emitting thyristor described above is also desirable to be operated by a 3.3V power supply system.

Referring to FIG. 1, there is shown an equivalent circuit diagram of a diode-coupled self-scanning light-emitting array driven by a voltage of 5V, in which a shift portion and light-emitting portion are separated. The self-scanning light-emitting element array comprises switches T1, T2, T3 . . . and write light-emitting element L1, L2, L3 . . . . Three-terminal light-emitting thyristors are used for both of the switch elements and write light-emitting elements. A diode-coupling structure is used in the shift portion, i.e., gates electrodes between adjacent switch elements are coupled together by a diode D, respectively. In the figure, VGA designates a power supply (normally −5V) which is connected to a gate electrode of each switch element via a load resistor. The gate electrode of each switch element is also connected to a gate electrode of a corresponding write light-emitting element. A start pulse φS is supplied to a gate electrode of the switch element T1, transfer clock pulses φ1 and φ2 alternately to cathode electrodes of the switch elements, and a write signal φI to cathode electrodes of the write light-emitting elements.

Referring to FIG. 2, there is shown a device structure of the self-scanning light-emitting element array in FIG. 1 formed in a chip, in which FIG. 2A is a plan view and FIG. 2B is a cross-sectional view taken along X—X line in FIG. 2A. As shown in the figures, on a P-type GaAs substrate 10 successively stacked are a P-type AlGaAs epitaxial layer 11, an N-type AlGaAs epitaxial layer 12, a P-type AlGaAs epitaxial layer 13, and an N-type AlGaAs epitaxial layer 14 to form a PNPN-structure. A self-scanning light-emitting element array is fabricated by using the PNPN-structure. Reference numeral 21 designates an ohmic electrode for the P-type AlGaAs layer 13, 22 an ohmic electrode for the N-type AlGaAs layer 14, 23 an ohmic electrode (a bottom common electrode) for the P-type GaAs layer 10, 60 a protective layer, 70 a VGA wiring, 71 a φ1 wiring, 72 a φ2 wiring, 73 a φI wiring, 80 a cathode island of the shift portion, 81 a cathode island for the coupling diode D, 82 a cathode island of the light-emitting portion, and 90 a resistor, respectively. In this structure, the coupling diode D uses upper two layers of the PNPN-structure, i.e., a P-N junction formed by the P-type AlGaAs layer 13 and N-type AlGaAs layer 14. The resistor 90 utilizes the P-type AlGaAs layer 13.

The operation of this self-scanning light-emitting array will now be described briefly. Assume that when transfer clock φ2 is driven to Low-level, the switch element T2 is turned on. At this time, the voltage of the gate electrode of the switch element T2 is elevated from −5V to approximately 0V. The effect of this voltage elevation is transferred to the gate electrode of the switch element T3 via the diode D to set the voltage thereof to approximately −1V which is a forward rise voltage (equal to a diffusion potential) of the diode D. However, the diode D is reverse-biased so that the voltage is not conducted to the gate G1, then the voltage of the gate electrode G1 remains at −5V. The turn-on voltage of a light-emitting thyristor is approximated to a gate electrode potential+a diffusion potential of a PN junction (approximately 1V) between a gate and cathode. Therefore, if a High-level voltage of a next transfer clock pulse φ2 is set to a voltage lower than approximately −2V (the voltage required to turn on the transfer element T3) and larger than approximately −4V (the voltage required to turn on the switch element T5), then only the switch element T3 is turned on and other switch elements remain off-state, respectively. As a result of which, on-state is transferred by means of the two-phase transfer clock pulses.

The start pulse φS works for starting the transfer operation described above. When the start pulse φS is driven to High level (approximately 0V) and the transfer clock pulse φ2 is driven to Low-level (approximately −2V—approximately −4V) at the same time, the transfer element T1 is turned on. Just after that, the start pulse φS is returned to a low level.

Assuming that the switch element T2 is in on-state, the voltage of the gate electrode of the switch element T2 is elevated from VGA to approximately 0V. Consequently, if the voltage of the write signal φI is lower than the diffusion potential (approximately 1V) of the PN junction, the light-emitting element L2 may be turned into a light-emitting state.

On the other hand, the voltage of the gate electrode of the switch element T1 is approximately −5V, and the voltage of the gate electrode of the switch element T3 is approximately −1V. Consequently, the write voltage of the light-emitting element L1 is approximately −6V, and the write voltage of the light-emitting element L3 is approximately −2V. It is appreciated that the voltage of the write signal φI which can write into only the light-emitting element L2 is in a range of (−1V)–(−2V). When the light-emitting element L2 is turned on, that is, in a light-emitting state, the amount of emitted light is determined by the amount of a current supplied by the write signal φI. Accordingly, the light-emitting elements may emit light at any desired amount thereof. In order to transfer on-state to the next light-emitting element, it is necessary to first turn off the element in on-state by temporarily dropping the voltage of the write signal φI down to 0V.

An operable voltage (a Low-level voltage of a clock pulse) VL for the diode-coupled self-scanning light-emitting element array described above is in the following condition;

$$VL < VGON - 2VD - Ith \times RP$$

wherein VGON is a gate voltage of a turned-on thyristor, VD a forward rise voltage of the coupling diode D, Ith a threshold current which turns on a thyristor, RP a parasitic resistor of a thyristor gate. VGON is approximately −0.3V, VD is 1.3V, and Ith×RP is approximately 0.3V, then VL is smaller than −3.1V. In order to realize a stable operation of the self-scanning light-emitting element array, an allowance of approximately 0.2V is required for the voltage VL. Consequently, a voltage of approximately 3.3V is required to operate the current self-scanning light-emitting element array. A 3.0V power supply system, therefore, can not operate the current self-scanning light-emitting element array.

While the PNPN-structure in which the P-type layer, N-type layer, P-type layer and N-type layer are stacked in this order on the P-type substrate has been illustrated, the PNPN-structure in which the N-type layer, P-type layer, N-type layer and P-type layer are stacked in this order on the N-type substrate may also be used, which has an opposite polarity in FIG. 1.

DISCLOSURE OF THE INVENTION

An object of the present invention is to provide a self-scanning light-emitting element array which is operated at a lowered operational voltage, i.e., 3.0V.

Another object of the present invention is to provide a light-emitting element having a logical function.

A further object of the present invention is to provide a light-emitting element array having a logical function.

A light-emitting element according to the present invention comprises: at least one light-emitting thyristor fabricated by a PNPN-structure in which a first conductivity-type semiconductor layer, a second conductivity-type semiconductor layer, a first conductivity-type semiconductor layer, and a second conductivity-type semiconductor layer are stacked in this order on a first conductivity-type semiconductor substrate, and including a gate electrode ohmically contacted to a gate layer of the PNPN-structure; and at least one schottky barrier diode structured by a schottky junction between the gate layer and at least one metal terminal.

In order to fabricate a diode-coupled self-scanning light-emitting element array using such a light-emitting element, the diode-coupled self-scanning light-emitting element array comprises: a plurality of first light-emitting thyristors arrayed in one dimension, each thereof serves as a switch; a plurality of coupling diodes, each thereof connects gate electrodes of the adjacent two first light-emitting thyristors; and a plurality of second light-emitting thyristors arrayed in one dimension, each gate electrode thereof is connected to a gate electrode of the corresponding first light-emitting thyristor. In this structure, a schottky barrier diode consisting of a schottky junction is used as the coupling-diode in place of a PN-junction.

The schottky barrier diode has an essentially lower barrier height compared to a PN-junction, and a forward rise voltage Vs of approximately 0.8V. Therefore, a power supply voltage may be decreased by approximately 0.5V rather than the case where a PN-junction is used. As a result, a self-scanning light-emitting element array may be operated at 3.0V.

In the case that a PN-junction formed in upper layers of a thyristor structured by a PNPN-structure is used as a coupling diode, when a current, the amount thereof is larger than a threshold value, flows through the diode, the thyristor is turned on so that the diode is not insulated from the substrate. In a schottky junction in which a metal is provided on a PNP-structure, the thyristor operation is not conducted so that the diode is always insulated from the substrate by means of the PNP-structure. Using the schottky junction, therefore, various logic circuits and logic functions may be implemented by the same process and structure as in the self-scanning light-emitting element array.

BRIEF DESCRIPTION OF THE DRAWINGS

FIG. 5 shows a current-voltage characteristic of a schottky contact.

BEST MODE FOR CARRYING OUT THE INVENTION

Embodiment 1

Figure 3A:
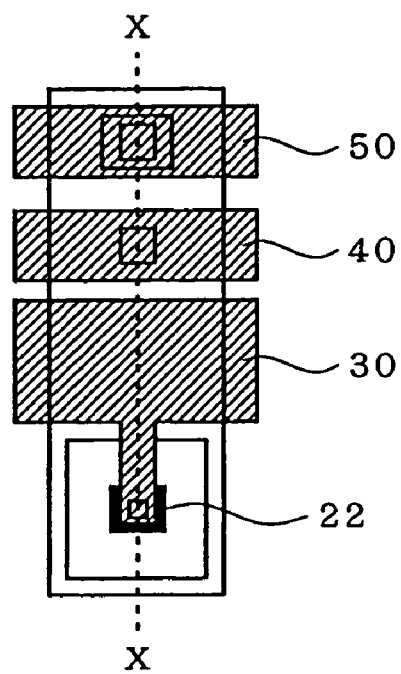
FIGS. 3A and 3B show a plan view and cross-sectional view of a device structure of a light-emitting element of the first embodiment.
Figure 3B:
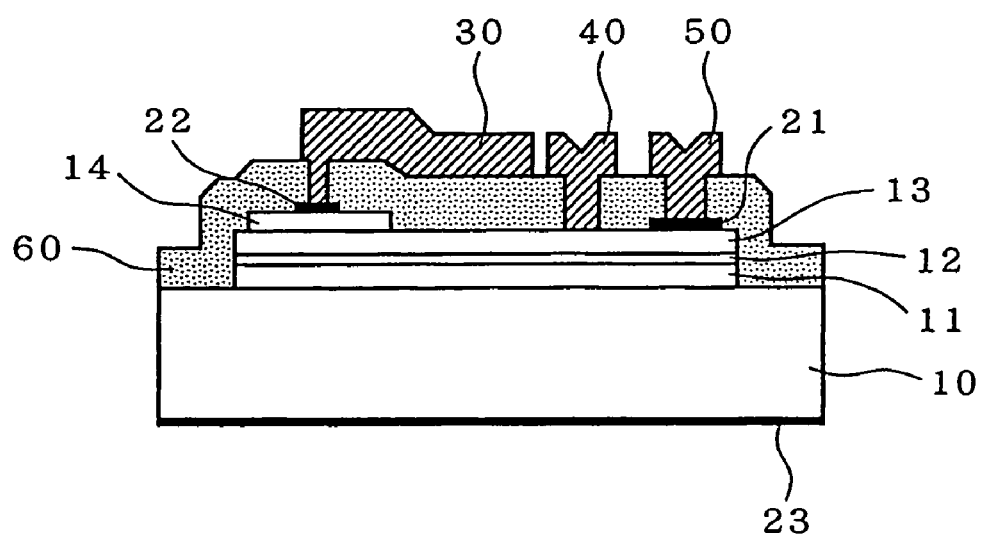

The present embodiment is directed to a light-emitting element having a schottky contact terminal on a gate layer of a PNPN-structure. A device structure of a light-emitting element formed in a chip is shown in FIG. 3 in which FIG. 3A is a plan view and FIG. 3B is a cross-sectional view taken along X—X line in FIG. 3A. On a first conductivity-type of GaAs substrate 10, there are stacked a first conductivity-type AlGaAs epitaxial layer 11, a second conductivity-type AlGaAs epitaxial layer 12, a first conductivity-type AlGaAs epitaxial layer 13, and a second conductivity-type AlGaAs epitaxial layer 14 in this order to form a PNPN-structure. A light-emitting thyristor is fabricated using this PNPN-structure.

The light-emitting thyristor comprises an ohmic electrode 21 formed an the first conductivity-type AlGaAs layer 13, an ohmic electrode 22 formed on the second conductivity-type AlGaAs layer 14, and an ohmic electrode (a common electrode) formed on a bottom surface of the first conductivity-type GaAs substrate 10. Reference numeral 60 shows a protective film.

A wiring 40 is directly schottky contacted to the first conductivity-type AlGaAs layer 13 via a through hole opened in the protective film 60 to form a schottky barrier diode.

Where the first conductivity-type is P-type and the second conductivity-type is N-type in the above-described structure, reference numeral 30 shows a cathode wiring, 40 a schottky contact cathode wiring of the diode, and 50 a gate wiring. On the other hand, where the first conductivity-type is N-type and the second conductivity-type is P-type, reference numeral 30 shows an anode wiring, 40 a schottky contact anode wiring of the diode, and 50 a gate wiring.

Figure 4A:
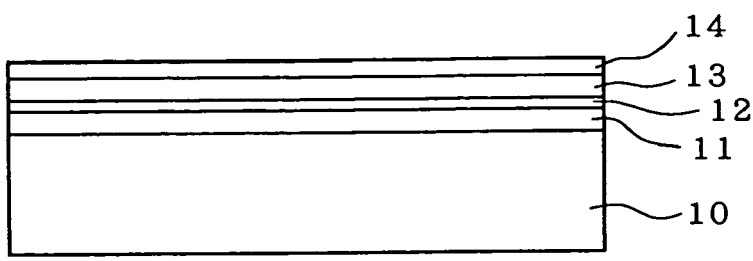
FIGS. 4A, 4B, 4C, 4D, and 4E illustrate a method for manufacturing a light-emitting element in FIG. 3.

A method for manufacturing a light-emitting element having the above-described structure will now be described with reference to FIGS. 4A–4E. It is assumed that the first conductivity-type is P-type. First, as shown in FIG. 4A, the P-type AlGaAs epitaxial layer 11, the N-type AlGaAs epitaxial layer 12, the P-type AlGaAs epitaxial layer (a gate layer) 13, and the N-type AlGaAs epitaxial layer (a cathode layer) 14 are epitaxially grown in this order on the P-type GaAs substrate 10.

Figure 4B:
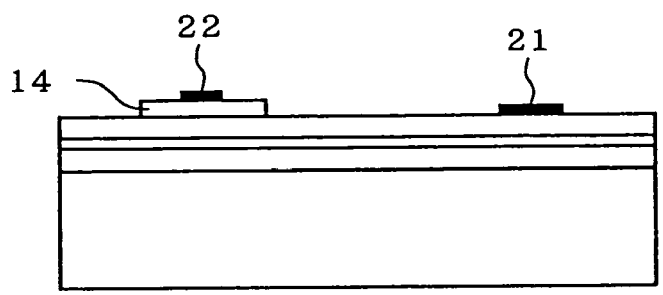

Next, as shown in FIG. 4B, the cathode layer 14 is patterned to expose the gate layer 13. A gate ohmic electrode 21 consisting of AuZn is formed on the gate layer 13 by a lift off method. While a cathode ohmic electrode 22 consisting of AuGe is formed on the cathode layer 14 by a lift off method.

Figure 4C:
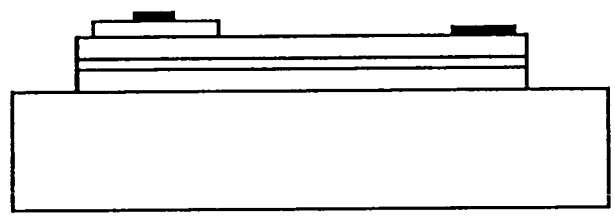

Then, as shown in FIG. 4C, an element isolation process is carried out by an etching.

Figure 4D:
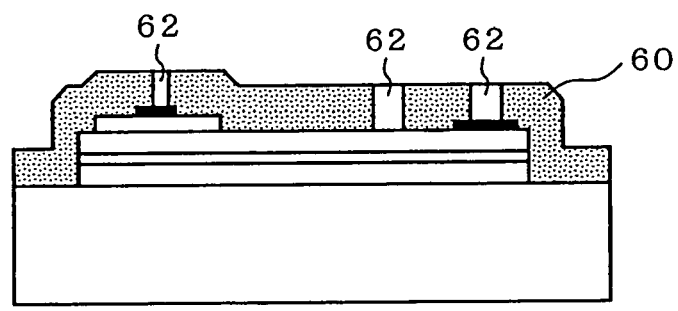

Subsequently, as shown in FIG. 4D, $SiO_2$ is deposited as the protecting film 60 by a plasma CVD. A contact hole 62 is opened through the protective film 60 by a reactive ion etching (RIE).

Figure 4E:
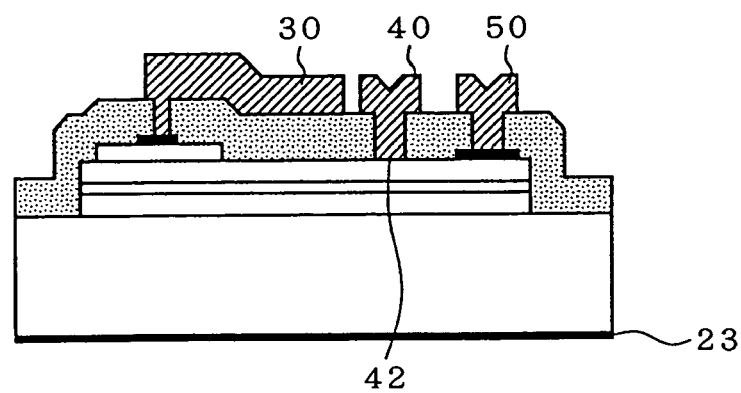

Finally, as shown in FIG. 4E, an aluminum (Al) film is deposited by a sputtering so that a stable metal-semiconductor contact is formed due to an initial cleaning effect at a portion 42 where the Al film is contacted to the gate layer 13. The metal-semiconductor contact constitutes a schottky contact by which a schottky barrier diode is structured.

The cathode wiring 30, schottky contact cathode wiring 40, and gate wiring 50 are formed by sputtering the Al film as described above. The electrode 23 is formed on the bottom surface of the GaAs substrate 1.

Referring to FIG. 5, there is shown a current-voltage characteristic between the schottky contact cathode wiring 40 and the gate wiring 50 in the light-emitting element structured as described above, i.e., a current-voltage characteristic of the schottky barrier diode. A voltage of the gate wiring 50 is varied with respect to the shottky contact cathode wiring 40. The schottky barrier diode has an essentially lower barrier height compared to a PN-junction, a forward rise voltage of approximately 0.8V, and a reverse current of −10 nA at −5V.

Therefore, if a schottky barrier diode is used for a coupling diode D, an operational voltage of a self-scanning light-emitting element array may be decreased by approximately 0.5V rather than the case where a PN-junction is used. As a result, a self-scanning light-emitting element array may be operated by a 3.0V power supply system.

In the present embodiment, an Al schottky contact is implemented on the gate layer of the PNPN-structure including the P-type substrate. According to this structure, an Al wiring material itself may be used for a schottky electrode material, resulting in a simple manufacturing process. Alternatively, a schottky electrode may be formed without using Al wiring material. In this case, materials such as Au, Al, Pt, Ti, Mo, W, WSi, TaSi, and the like may be used.

As stated above, using a light-emitting element having a schottky contact terminal on the gate layer of a PNPN-structure, a light-emitting element and light-emitting element array having a logical function may be implemented, and a light-emitting element array driven by 3.0V may also be realized.

Embodiment 2

Figure 1:
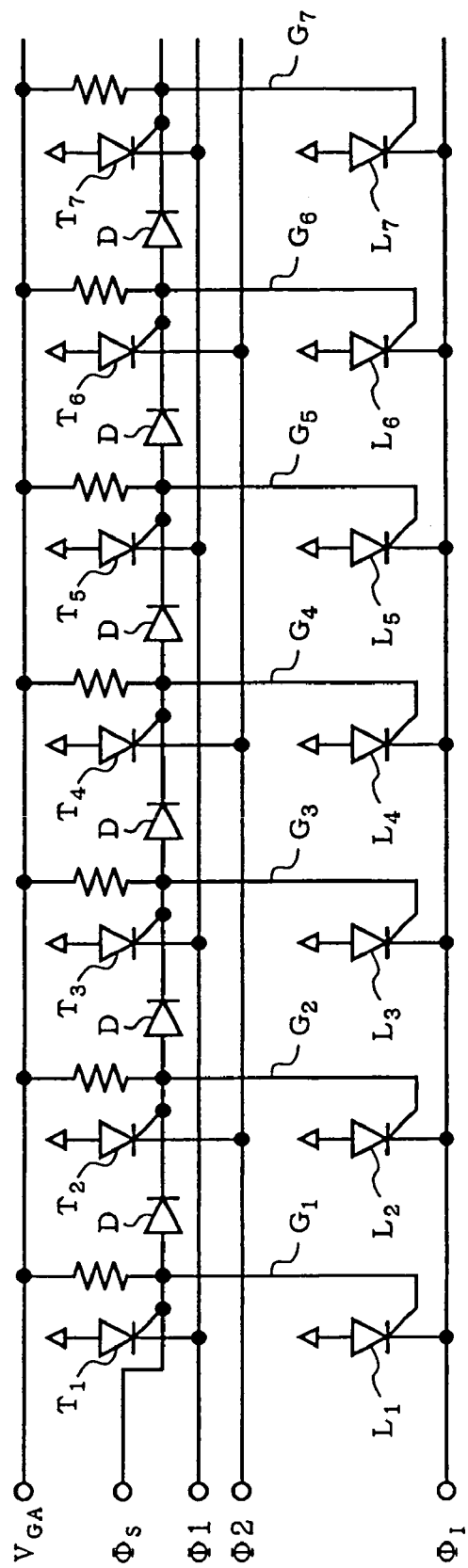
FIG. 1 shows an equivalent circuit diagram of a diode-coupled self-scanning light-emitting array driven by a voltage of 5V, in which a shift portion and light-emitting portion are separated.
Figure 2A:
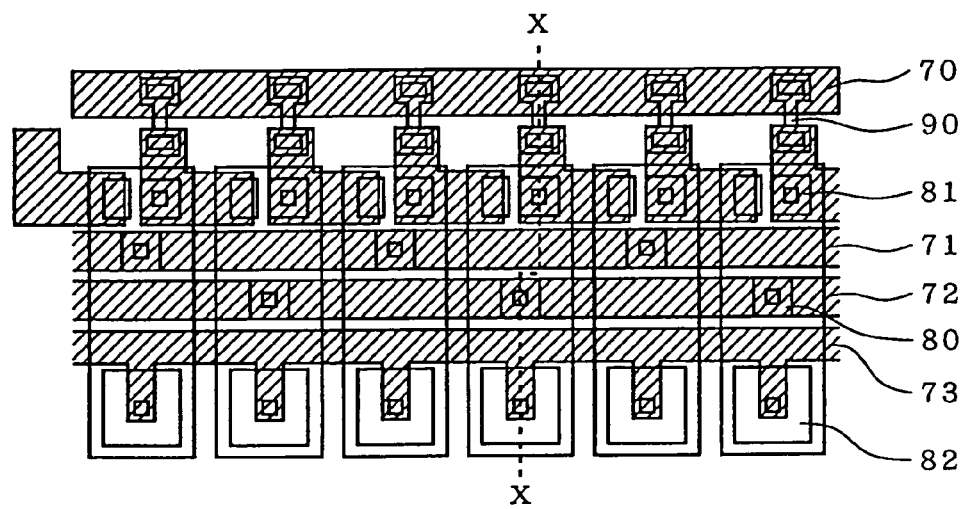
FIGS. 2A and 2B show a plan view and cross-sectional view of a self-scanning light-emitting element array formed in a chip.
Figure 2B:
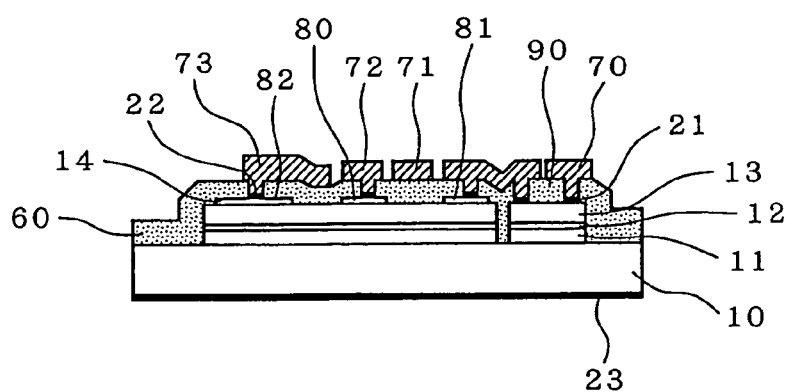
Figure 6:
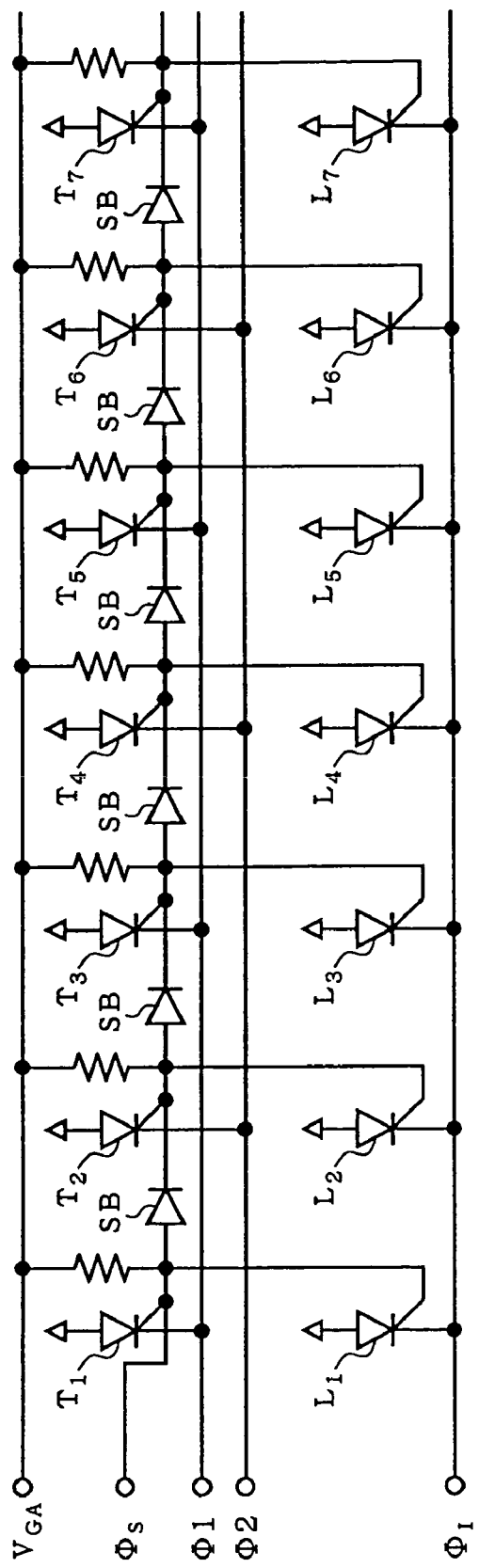
FIG. 6 shows an equivalent circuit diagram of a self-scanning light-emitting array of the second embodiment.

The present embodiment is directed to a self-scanning light-emitting element array using a schottky barrier diode as a coupling diode. FIG. 6 shows a circuit diagram of the self-scanning light-emitting element array, which is the same as the circuit diagaram in FIG. 1 except that the coupling diode D is replaced by a schottky barrier diode SB.

Figure 7A:
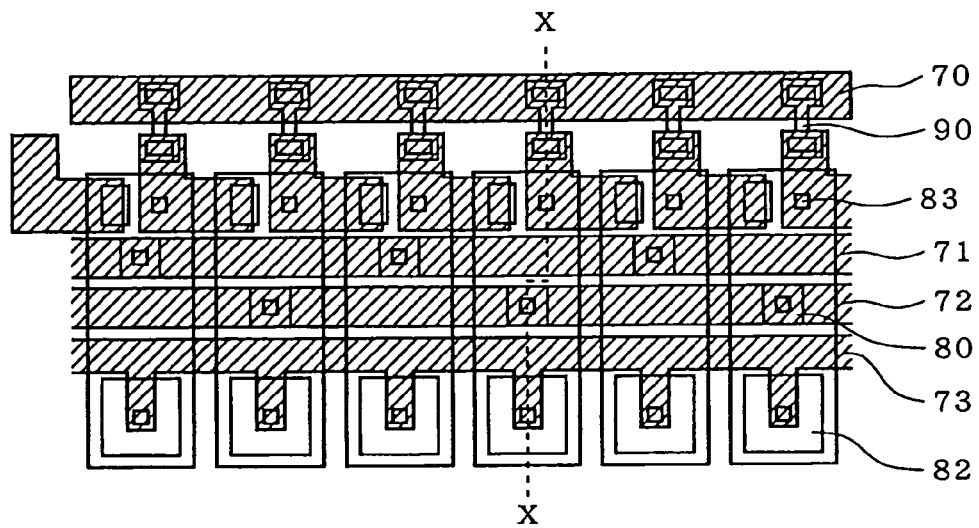
FIGS. 7A and 7B show a plan view and cross-sectional view of a device structure of the self-scanning light-emitting element array in FIG. 6.
Figure 7B:
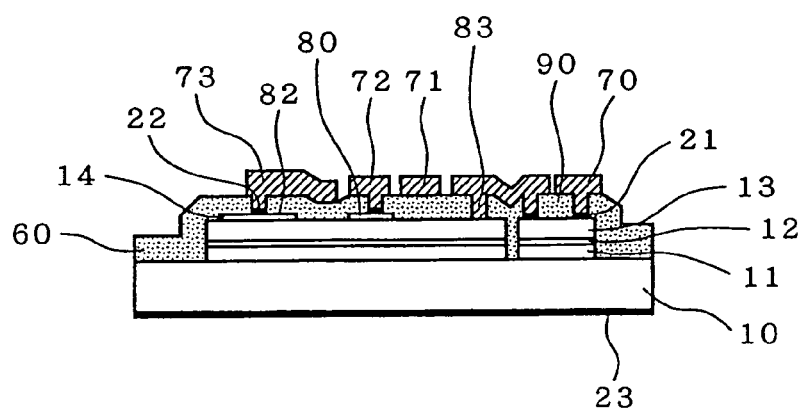

Referring to FIGS. 7A and 7B, there is shown a device structure of the diode-coupling self-scanning light-emitting element array formed in a chip. FIG. 7A is a plan view and FIG. 7B is a cross-sectional view taken along X—X line in FIG. 7A. On a P-type GaAS substrate 10, there are stacked a P-type AlGaAs epitaxial layer 11, a N-type AlGaAs epitaxial layer 12, a P-type AlGaAs epitaxial layer 13, and a N-type AlGaAs epitaxial layer 14 in this order to form a PNPN-structure. A light-emitting thyristor is fabricated using the PNPN-structure.

In the figures, reference numeral 21 designates an ohmic electrode for the P-type AlGaAs layer 13, 22 an ohmic electrode for the N-type AlGaAs layer 14, 23 an ohmic electrode (a bottom surface common electrode) for the P-type GaAs substrate 10, 60 a protective film, 70 a VGA wiring, 71 a φ1 wiring, 72 a φ2 wiring, 73 a φI wiring, 80 a cathode island of the shift portion, 82 a cathode island of the light-emitting portion, 83 a schottky barrier diode used as a coupling diode, and 90 a resistor. The schottky barrier diode 83 is formed by a metal-semiconductor contact between the Al wiring and N-type AlGaAs layer 14, and the resistor 90 is formed by the P-type AlGaAs layer 13.

As stated above, using a schottky barrier diode for the coupling diode in the diode-coupled self-scanning light-emitting element array, a forward voltage is lower by approximately 0.5V than that in a PN-junction diode. Therefore, a stable operation at VL=−2.8V for the self-scanning light-emitting element array may be realized.

Embodiment 3

The present embodiment is directed to a self-scanning light-emitting element array in which the start pulse φS terminal is deleted in the self-scanning light-emitting element array of the embodiment 2, thereby decreasing the number of bonding pads on a chip. In the circuit of FIG. 6, the start pulse terminal φS is deleted, and then the function thereof is realized by the clock pulse terminal φ2.

Figure 8:
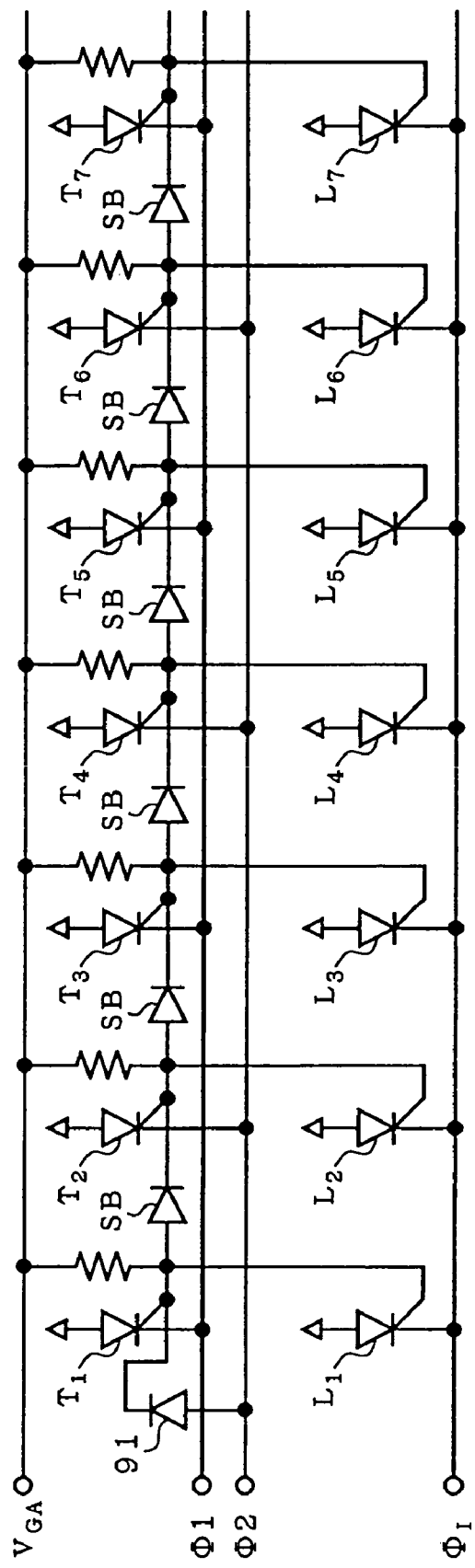
FIG. 8 shows an equivalent circuit diagram of a self-scanning light-emitting array of the third embodiment.

FIG. 8 shows a circuit diagram of this embodiment. In this case, the gate of the switch element T1 is connected to the clock pulse terminal φ2 via a schottky barrier diode 91 for forming a start pulse. The clock pulse φ2 is supplied to the gate of the switch element T1 as a start pulse via the diode 91.

The self-scanning light-emitting element array uses a schottky barrier diode as a coupling diode in the same way as the embodiment 2, so that the operation by lower power supply voltage may be realized.

Embodiment 4

The present embodiment is directed to a self-scanning light-emitting element array in which the start pulse φS terminal and VGA terminal are deleted in the self-scanning light-emitting element array of the embodiment 2, thereby decreasing the number of bonding pads on a chip. In the circuit of FIG. 8 illustrated with reference to the embodiment 3, the VGA terminal is deleted to synthesize the VGA power supply from the clock pulses φ1 and φ2.

Figure 9:
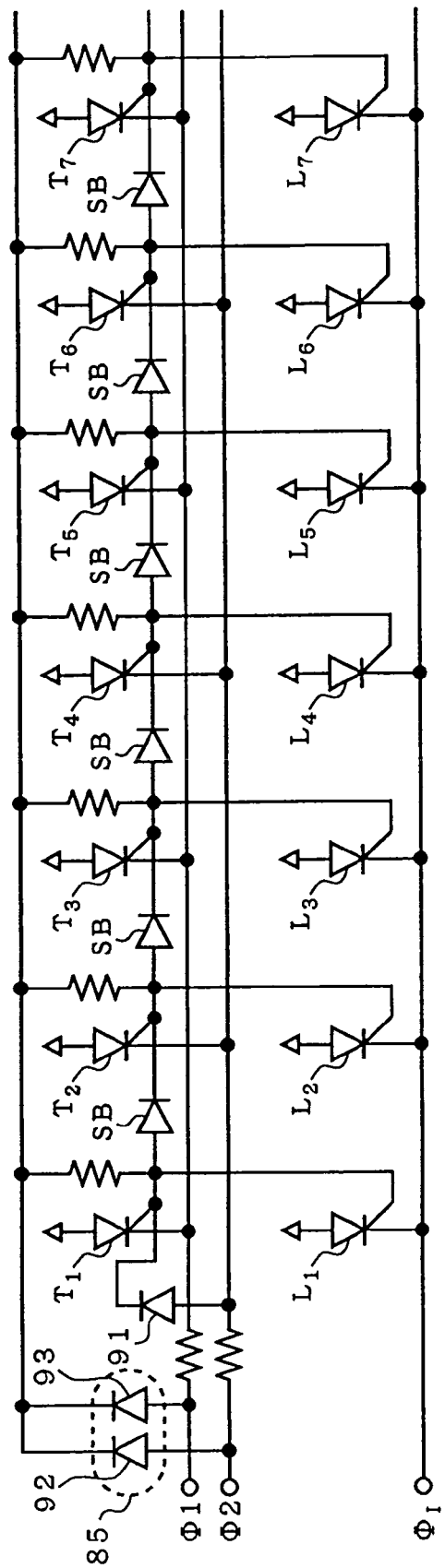
FIG. 9 shows an equivalent circuit diagram of a self-scanning light-emitting array of the fourth embodiment.

FIG. 9 shows a circuit diagram of this embodiment. A diode-diode logic two-input OR gate 85 is used to synthesize the VGA power supply from the clock pulses φ1 and φ2. Schottky barrier diodes 92 and 93 are utilized as diodes for this OR gate.

Where a PN-junction between a gate and a cathode is used as a diode in a conventional manner, if a current, the amount thereof is more than a predetermined value, flows through the diode, a PNPN parasitic thyristor including the PN-junction is turned on so that a voltage of the VGA terminal is fixed to approximately VD (a forward rise voltage of a diode). Therefore, the amount of a current through the VGA line is limited. A parasitic thyristor is not formed where the schottky barrier diode 92 and 93 are used in place of PN-junctions, so that the amount of a current through the VGA line is not limited. Because the current through the VGA line determines the transfer speed of a self-scanning light-emitting element array, a higher transferring self-scanning light-emitting element array may be implemented by using a schottky barrier diode.

While both the start pulse φS terminal and the VGA terminal are deleted in this embodiment, only the VGA terminal may be deleted. In this case, the two-input OR gate consisting of schottky barrier diodes 92 and 93 is provided in the circuit of FIG. 1.

Embodiment 5

The present embodiment is directed to a light-emitting element, the light-emitting state thereof may be controlled by providing an OR gate consisting of a diode-diode logic on a gate of a light-emitting element for ORing gate signals the number thereof is equal to or more than two.

Figures 10A, 10B:
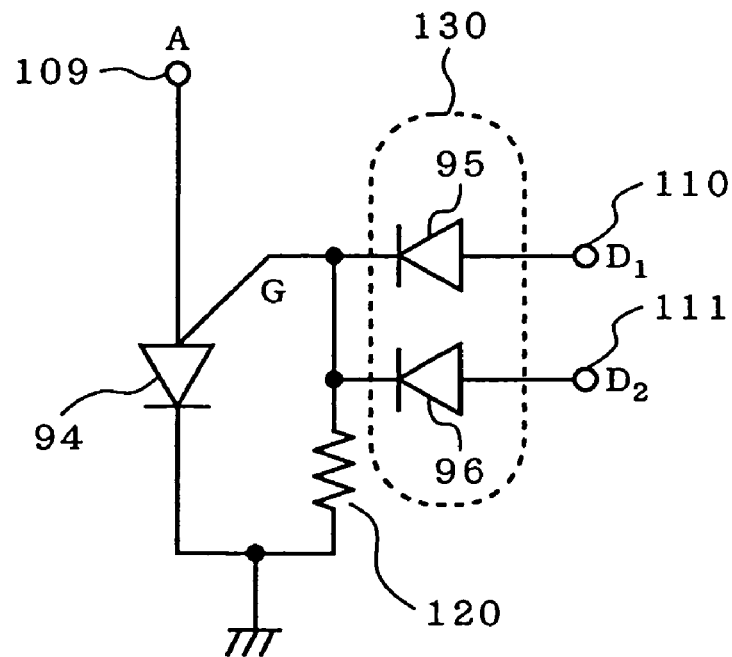
FIGS. 10A and 10B show a circuit diagram of a light-emitting element of the fifth embodiment and a truth table for operation thereof.

FIG. 10A shows a circuit diagram of this embodiment. As shown in FIG. 1A, a two-input OR gate 130 consisting of a diode-diode logic structured by schottky barrier diodes 95 and 96 is provided to a gate terminal G of a three-terminal thyristor 94 (a first conductivity-type is N-type and a second conductivity-type is P-type). The anode of the light-emitting thyristor 94 is connected to an anode terminal 109, the cathode thereof directly to the ground, and the gate thereof to respective cathodes of the diodes 95 and 96. The cathodes of the diodes 95 and 96 are also connected to the ground via a resistor 120. The anodes of the diodes 95 and 96 are connected to the anode terminal 110 and 111 (i.e., the input terminals of the OR gate 130).

Figure 11A:
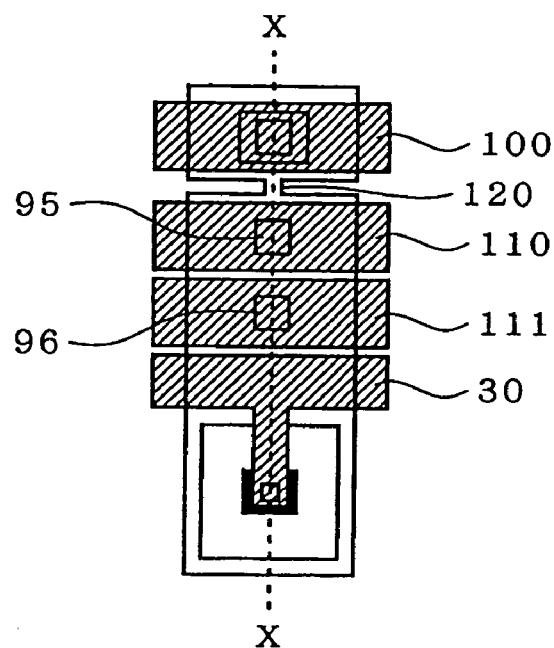
FIGS. 11A and 11B show a plan view and cross-sectional view of a device structure of the light-emitting element in FIG. 1A.
Figure 11B:
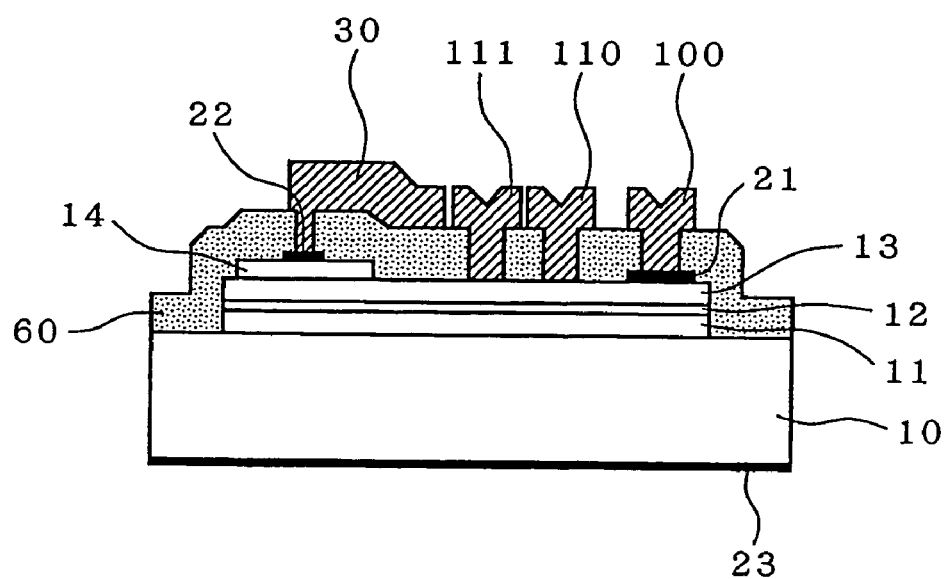

Referring to FIGS. 11A and 11B, there is shown a device structure of the light-emitting element in FIG. 10A. FIG. 11A is a plan view and FIG. 11B is a cross-sectional view taken along an X—X line in FIG. 11A. The elements in FIGS. 11A and 11B common to that in FIGS. 3A and 3B are identified by the same reference numerals. The diodes 95 and 96 are constituted by schottky contacts between the anode terminals 110, 111 and the gate layer 13, respectively. The resistor 120 is formed by narrowing the width of the gate layer 13 to form a furrow. One end of the resistor 120 is ohmically contacted to the gate layer 13 via the electrode 21 to which the wiring 100 is connected, the wiring being conducted to the ground.

It is conceivable that the three-terminal light-emitting thyristor 94 itself is originally a logic circuit which may controlled by two terminals, i.e., a gate and anode. A light-emitting state S ("1" designates light-emitting and "0" non light-emitting) is expressed as follows;

$$S = A \wedge \overline{G} \qquad (1).$$

wherein "G" is a gate level (High-level designates "1" and Low-level "0") and "A" is an anode level (High-level designates "1" and Low-level "0"). Assuming that the levels of the input terminals 110 and 111 of the OR gate 130 are D1 and D2, respectively, the anode level "A" is in High-level while the levels D1 and D2 are both in Low-level to light up the thyristor 94, as shown in a truth table in FIG. 10B. In the truth table, "*" designate any of High-level and Low-level.

Figures 12A, 12B:
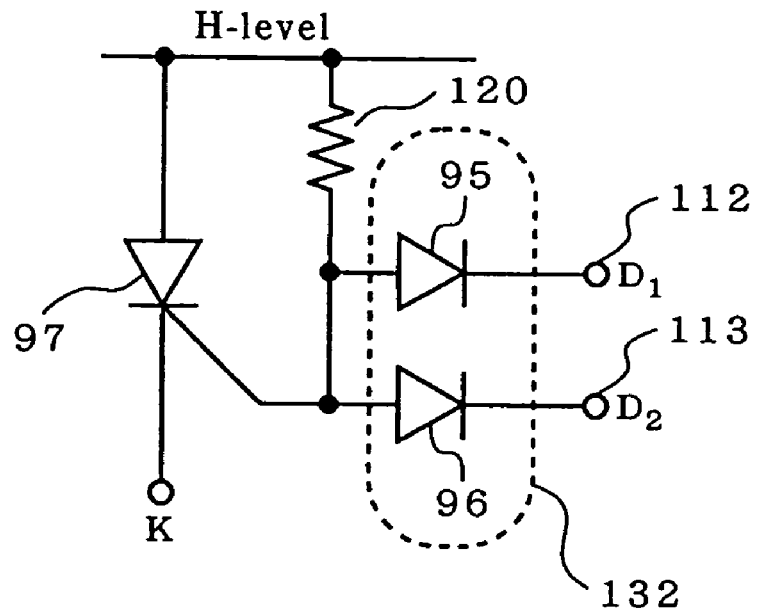
FIGS. 12A and 12B show a circuit diagram of another light-emitting element of the fifth embodiment and a truth table for operation thereof.

In the embodiment described above, while the light-emitting element may be implemented with the first conductivity-type being N-type and the second conductivity-type being P-type in the PNPN-structure, a light-emitting element may also implemented with the first conductivity-type being P-type and the second conductivity-type being N-type. A circuit diagram of the latter light-emitting element is shown in FIG. 12A, and a truth table thereof is shown in FIG. 12B. As shown in FIG. 12A, a two-input AND gate 132 consisting of a diode-diode logic is provided to the gate of a light-emitting thyristor 97. The AND gate is constituted by schottky barrier diodes 95 and 96. The direction of each schottky barrier diode is opposite to that in FIG. 10A. The anode of the light-emitting thyristor 97 is connected to High-level, and the anodes of the diodes 95, 96 are connected to High-level via the resistor 120.

Assuming that the cathode level of the light-emitting thyristor is "k" (High-level designates "1" and Low-level "0") in the structure of FIG. 12A, a light-emitting state S is expressed as follows;

$$S = \overline{K} \wedge G \qquad (2).$$

Figures 13A, 13B:
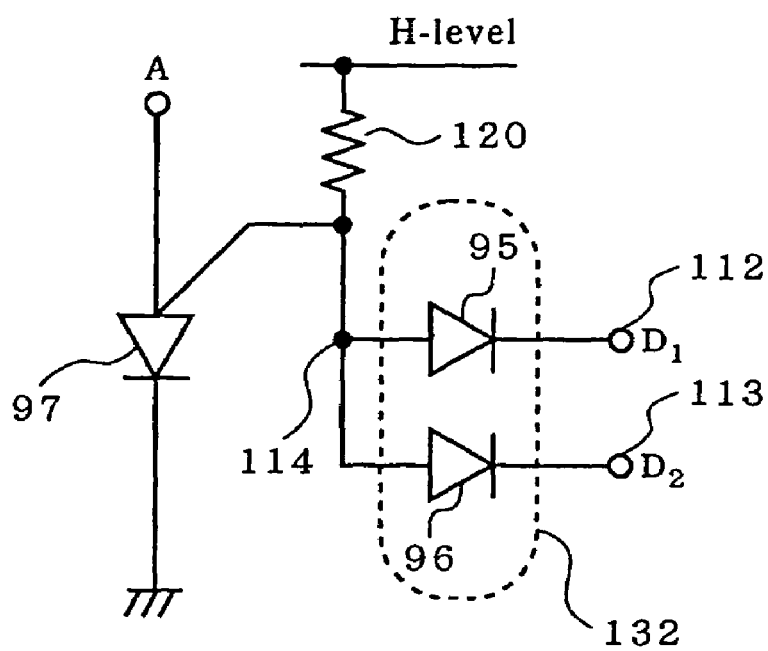
FIGS. 13A and 13B show a circuit diagram of another light-emitting element of the fifth embodiment and a truth table for operation thereof.
Figure 14:
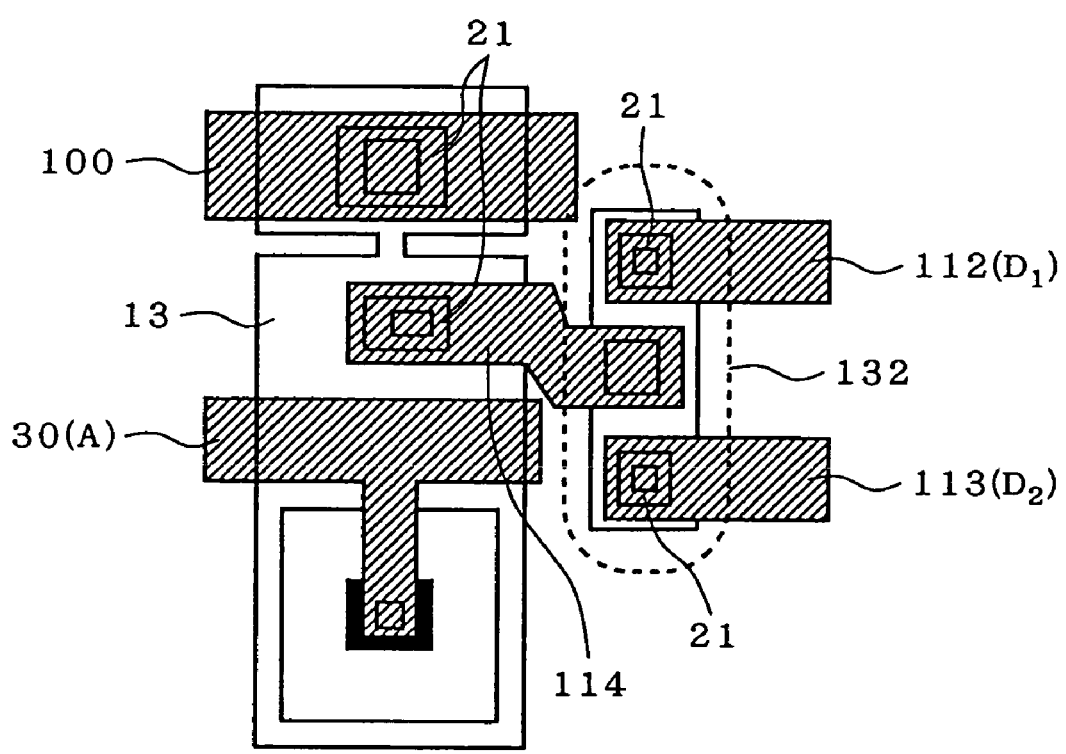
FIG. 14 shows a plan view of a device structure of the light-emitting thyristor in FIG. 13.

Therefore, the light-emitting thyristor may be lighted up, when the cathode level "K" is driven to Low-level while the levels D1 and D2 of the input terminals 112 and 113 of the AND gate 132 are both in High-level as shown in the truth table of FIG. 12B.

Where the first conductivity-type is N-type and the second conductivity-type is P-type, the thyristor may also be combined with a two-input AND gate consisting of a diode-diode logic. A circuit diagram and truth table thereof are shown in FIGS. 13A and 13B, respectively. FIG. 14 shows a device structure of the light-emitting element, in which reference numeral 13 designates a gate layer of the light-emitting thyristor 97, 21 an ohmic electrode, 132 the two-input AND gate consisting of diode-diode logic, 112 and 113 inputs of the AND gate 132, and 114 an output terminal of the AND gate 132. The AND gate 132 is formed on an island independent of the gate layer 13 of the light-emitting thyristor. As shown in the truth table of FIG. 13B, the light-emitting thyristor 97 may be lighted up by the combination of the input levels "D1", "D2" of the AND gate 132 and the anode level "A" of the light-emitting thyristor 97.

Figures 15A, 15B:
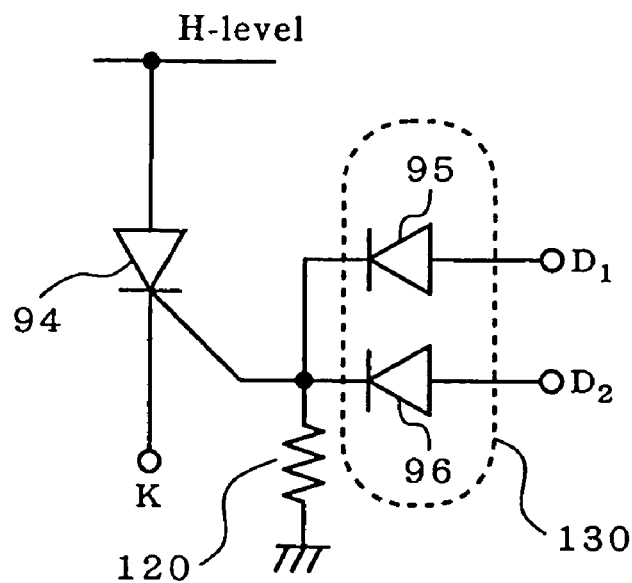
FIGS. 15A and 15B show a circuit diagram of another light-emitting element of the fifth embodiment and a truth table for operation thereof.

Referring to FIG. 15A, there is shown a circuit diagram of a light-emitting element in which the first conductivity-type is P-type and the second conductivity-type is N-type. A two-input OR gate 130 consisting of a diode-diode logic is provided to a gate of the light-emitting thyristor 94. The OR gate is constituted by schottky barrier diodes 95 and 96. In this circuit, the light-emitting thyristor 94 may be lighted up by the combination of the input levels "D1", "D2" of the OR gate 130 and the cathode level "K" of the light-emitting thyristor 94 as shown in the truth table of FIG. 15B.

While the example has been described in which an OR gate or AND gate consisting of a diode-diode logic is provided to a gate of the light-emitting thyristor, the OR gate or AND gate may be provided to an anode or cathode of the light-emitting thyristor. As shown in the expressions (1) and (2), the thyristor is turned on when a logical value of the anode or cathode and a logical value of the gate are opposite to each other, thereby implementing various logics without preparing a NOT gate. Examples of a light-emitting element including a logical function are shown in FIGS. 16–19.

Figures 16A, 16B:
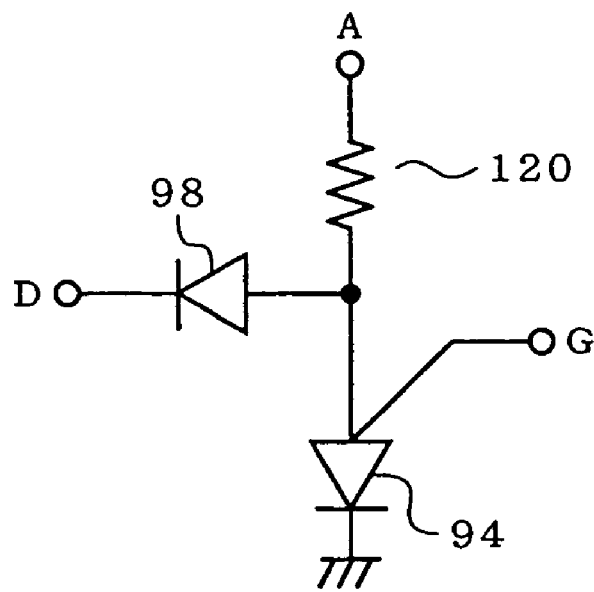
FIGS. 16A and 16B show a circuit diagram of another light-emitting element of the fifth embodiment and a truth table for operation thereof.

FIG. 16A shows a light-emitting element in which a schottky barrier diode 98 is provided to an anode of the light-emitting thyristor 94. Assuming that the level of a cathode terminal of the diode 98 is "D", the level of an anode terminal of the light-emitting thyristor 94 via the resistor 120 is "A", and the level of a gate terminal of the light-emitting thyristor 94 is "G", the light-emitting element operates as shown in a truth table of FIG. 16B.

Figures 17A, 17B:
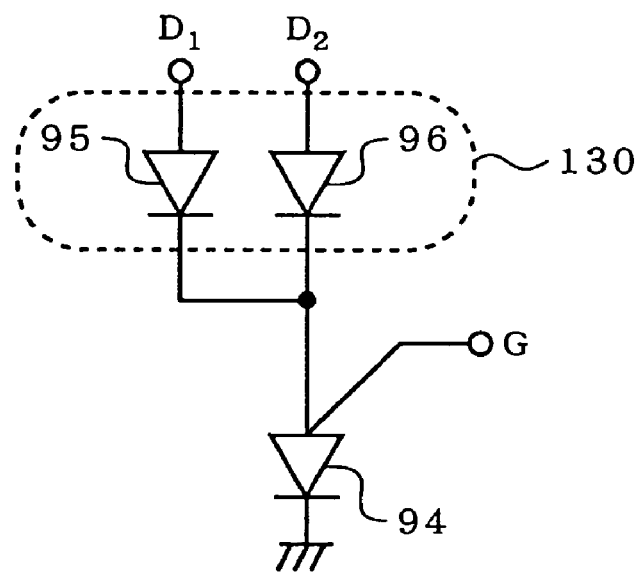
FIGS. 17A and 17B show a circuit diagram of another light-emitting element of the fifth embodiment and a truth table for operation thereof.

FIG. 17A shows a light-emitting element in which a two-input OR gate 130 consisting of schottky barrier diodes 95 and 96 is provided to an anode of the light-emitting thyristor 94. The light-emitting element operates as shown in a truth table of FIG. 17B.

Figures 18A, 18B:
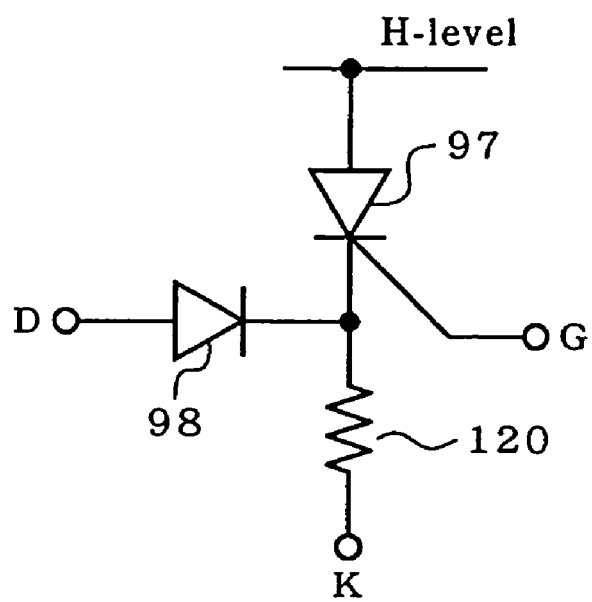
FIGS. 18A and 18B show a circuit diagram of another light-emitting element of the fifth embodiment and a truth table for operation thereof.

FIG. 18A shows an example in which a schottky barrier diode 98 is provided to a cathode of the light-emitting thyristor 97. The light-emitting element operates as shown in a truth table of FIG. 18B.

Figures 19A, 19B:
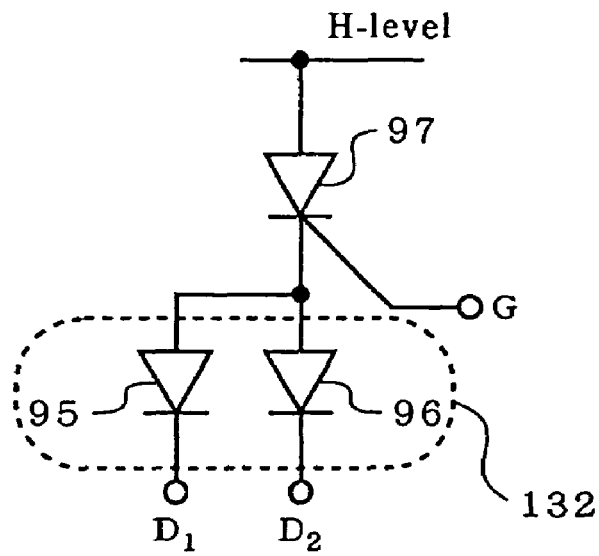
FIGS. 19A and 19B show a circuit diagram of another light-emitting element of the fifth embodiment and a truth table for operation thereof.

FIG. 19A shows a light-emitting element in which a two-input AND gate 132 consisting of schottky barrier diodes 95 and 96 is provided to a cathode of the light-emitting thyristor 97. The light-emitting element operates as shown in a truth table of FIG. 19B.

While the examples in which the number of inputs of each logic gate is less than or equal to 2, it will be apparently appreciated that the present invention may be applicable to a logic gate including inputs the number thereof is equal to or more than 3.

Embodiment 6

The present embodiment is directed to a light-emitting element in which RS-FF (Set-Reset Flip-Flop) is provided as a sequence circuit to control a light-emitting state of the light-emitting element.

Figure 20A:
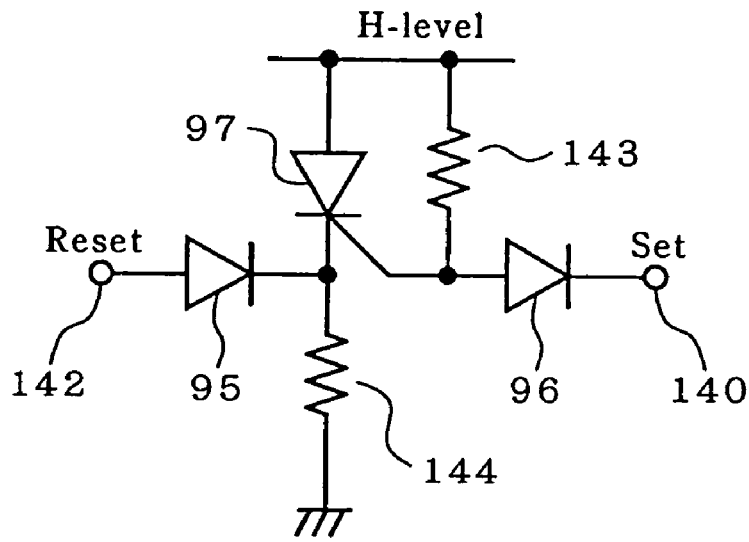
FIGS. 20A and 20B show a circuit diagram of a light-emitting element of the sixth embodiment and a truth table for operation thereof.
Figure 20B:
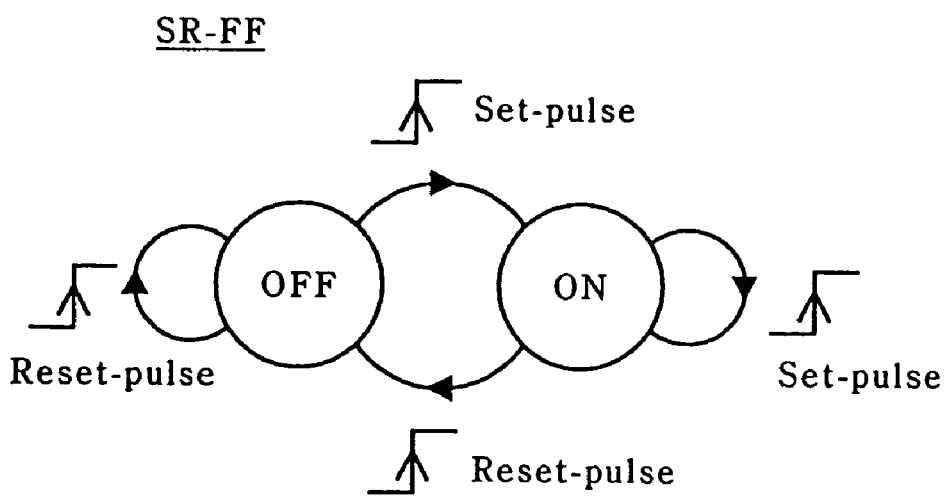

FIGS. 20A and 20B show a structure of the light-emitting element and a state transition thereof. In FIG. 20B, the situation in which two states, i.e., "ON" and "OFF" are changed by a set or reset pulse is illustrated. According to this structure, a set terminal 140 and reset terminal 142 may be provided via schottky barrier diodes 95 and 96 utilizing the characteristic such that a light-emitting thyristor may hold an on-state. By driving the set terminal 140 to High-level, a voltage of the gate terminal of the light-emitting thyristor 97 goes near to a substrate potential to turn on the light-emitting thyristor. When the reset terminal 142 is driven to High-level during on-state, the absolute value of a rise voltage of the schottky barrier diode 95 becomes smaller than the absolute value of a cathode voltage of the on-state light-emitting thyristor, so that the light-emitting thyristor is clamped with the rise voltage of the schottky barrier diode 95. As a result, the light-emitting thyristor 97 is turned off.

Figure 21A:
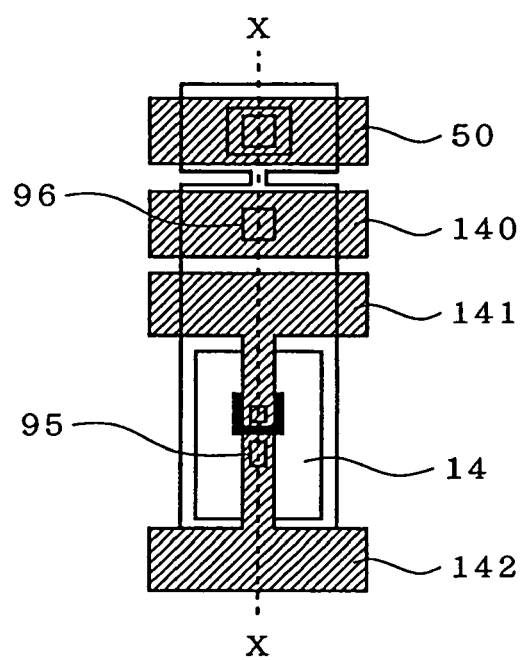
FIGS. 21A and 21B show a plan view and cross-sectional view of a device structure of the light-emitting element in FIG. 20.
Figure 21B:
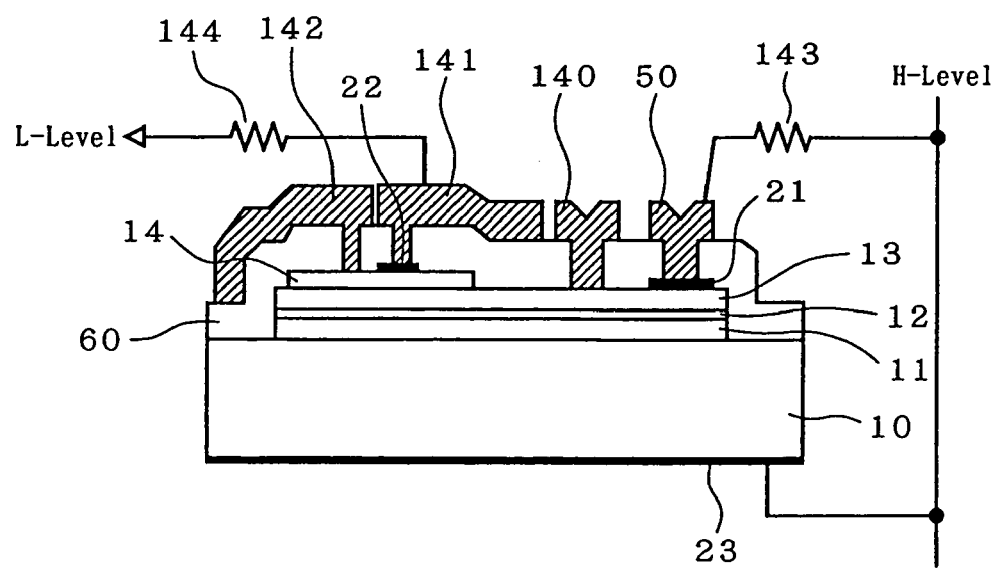

An example of the device structure in which the first conductivity-type is P-type and the second conductivity-type is N-type is shown in FIGS. 21A and 21B. FIG. 21A is a plan view and FIG. 21B is a cross-sectional view taken along an X—X line in FIG. 21A. In the figures, reference numeral 140 designates a set terminal, 141 a cathode terminal, 142 a reset terminal, and 143 and 144 resistors. Other components that are the same as in FIG. 3 are identified by the same reference numerals. In this structure, a schottky barrier diode 95 for the reset terminal is formed on a cathode island 14 of the light-emitting thyristor 97.

Figure 22:
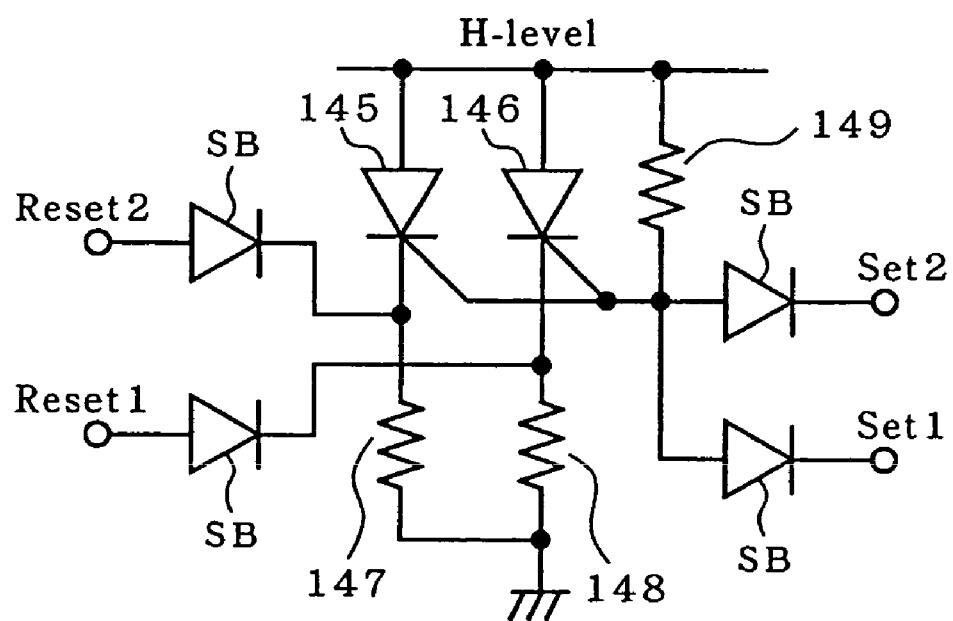
FIG. 22 shows a circuit diagram of another light-emitting element of the sixth embodiment.

Referring FIG. 22, there is shown an example of the structure in which two light-emitting thyristors are used to provide two set terminals and two reset terminals, respectively. The light-emitting thyristors are controlled by AND-ing two set signals or two reset signals. In the figure, reference numerals 145 and 146 designate two light-emitting thyristor, 147, 148 and 149 resistors, "SB" a schottky barrier diode. This structure may be used as a static memory in which any bit may be set or reset, because each light-emitting thyristor may be controlled by two address lines. It is also possible that the number of set/reset terminals is equal to or more than 3.

Embodiment 7

The present embodiment is directed to a two-dimensional matrix array of light-emitting elements using a light-emitting element provided with an AND gate consisting of a diode-diode logic of the embodiment 5 shown in FIG. 12A.

Figure 23:
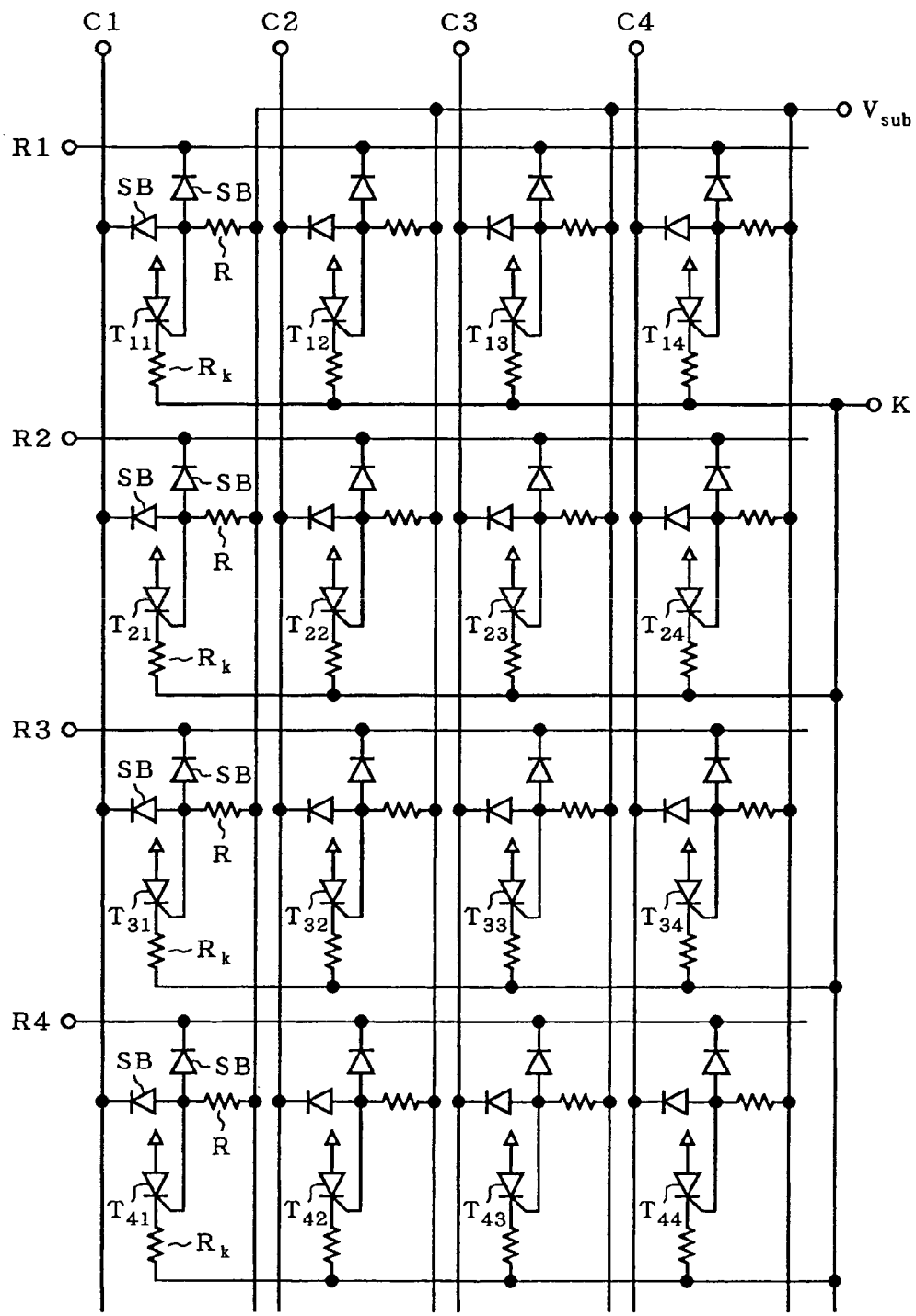
FIG. 23 shows a circuit diagram of a two-dimensional matrix light-emitting element array of the seventh embodiment.

FIG. 23 shows a circuit diagram of the matrix array. Light-emitting thyristors Tij (i=1,2,3, . . . , j=1, 2, 3, . . . ) are arrayed in an i×j matrix. To a gate of each light-emitting thyristor connected is a two-input AND gate consisting of two schottky barrier diodes SB. Two input terminals of each AND gate are connected to a row line Ri (i=1,2,3, . . . ) and column line Cj (j=1,2,3, . . . ), respectively. A matrix array of only 4 rows×4 columns is shown in the figure for a simplicity thereof.

A gate of each light-emitting thyristor Tij is also connected a substrate potential terminal Vsub of the PNPN-structure via a corresponding resistor R, and a cathode of each light-emitting thyristor Tij is connected a common cathode terminal K via a resistor Rk.

In the two-dimensional matrix light-emitting element array as described above, the thyristor Tij is lighted up when the row line Ri and column line Cj are both in High-level and the terminal K is in Low-level as illustrated in the truth table of FIG. 12B. While one light-emitting thyristor is lighted up, if another light-emitting thyristor is selected, the selected light-emitting element may be lighted up at the same time. That is, a plurality of light-emitting thyristors may be statically lighted up.

While an AND gate has been used in this embodiment, it will be understood that an OR gate may also be used.

Embodiment 8

The present embodiment is directed to a one-dimensional array of light-emitting elements using a light-emitting element provided with an AND gate consisting of a diode-diode logic of the embodiment 5 shown in FIG. 12A.

Figure 24:
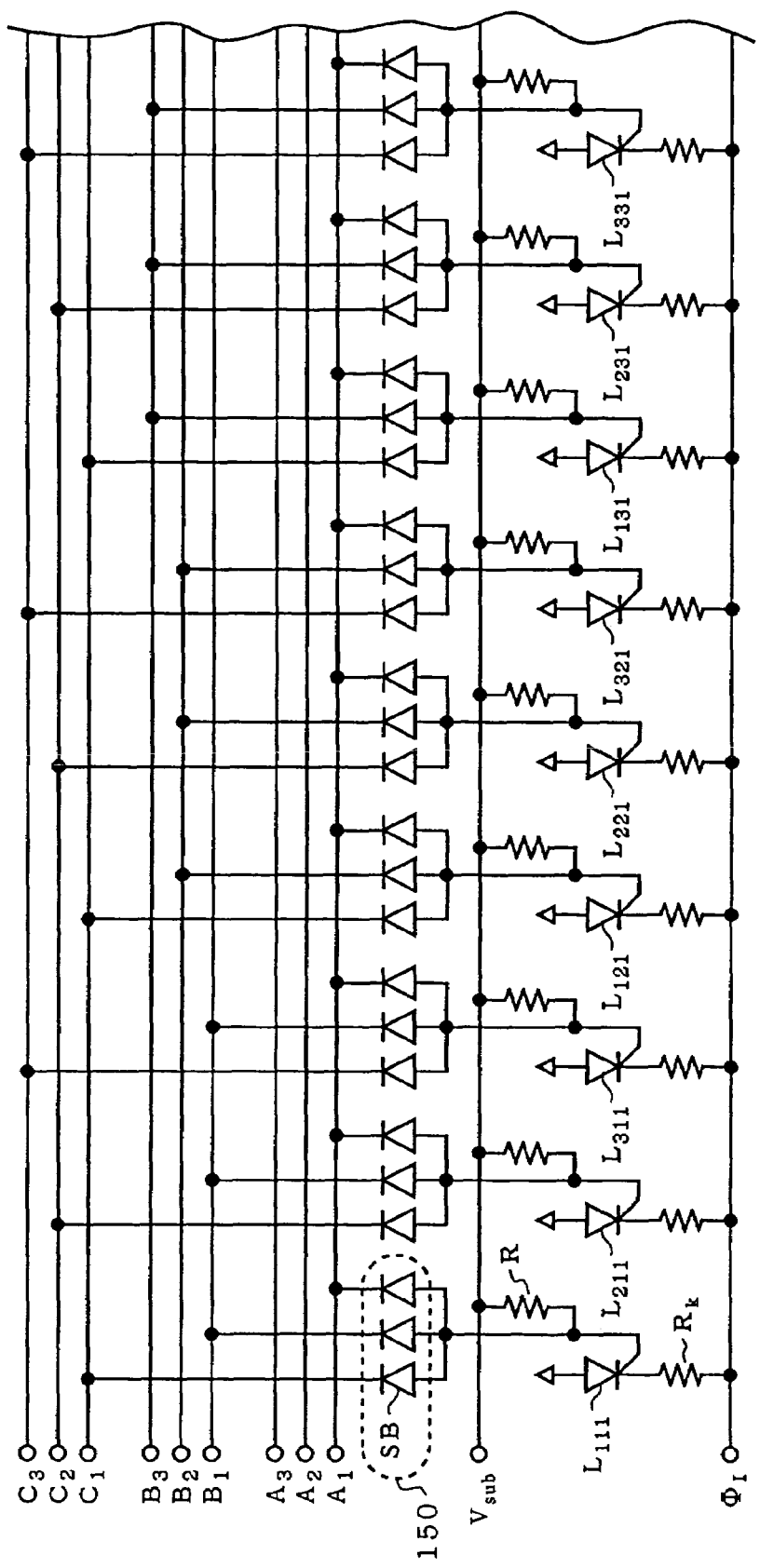
FIG. 24 shows a circuit diagram of a one-dimensional light-emitting element array of the eighth embodiment.

FIG. 24 shows a circuit diagram of the array. Light-emitting thyristors L111, L211, L311, . . . are arrayed in one dimension. To a gate of each light-emitting thyristor L connected is a three-input AND gate 150 consisting of three schottky barrier diode SB. Three input terminals of each AND gate are connected in matrix to three sets of signal lines (A1, A2, A3), (B1, B2, B3), and (C1, C2, C3) so that the light-emitting states of 27 light-emitting thyristors may be controlled by 9 lines A1–A3, B1–B3, and C1–C3. In the figure, while only a portion where one of input terminals of the AND gate 150 is connected to the signal line A1 is shown, the light-emitting thyristors, the number thereof is in fact three times that in the figure, are arrayed.

A cathode of each light-emitting thyristor is connected to a φI line via a resistor RK, and a gate thereof is connected to a substrate potential terminal Vsub via a resistor R.

Figure 25A:
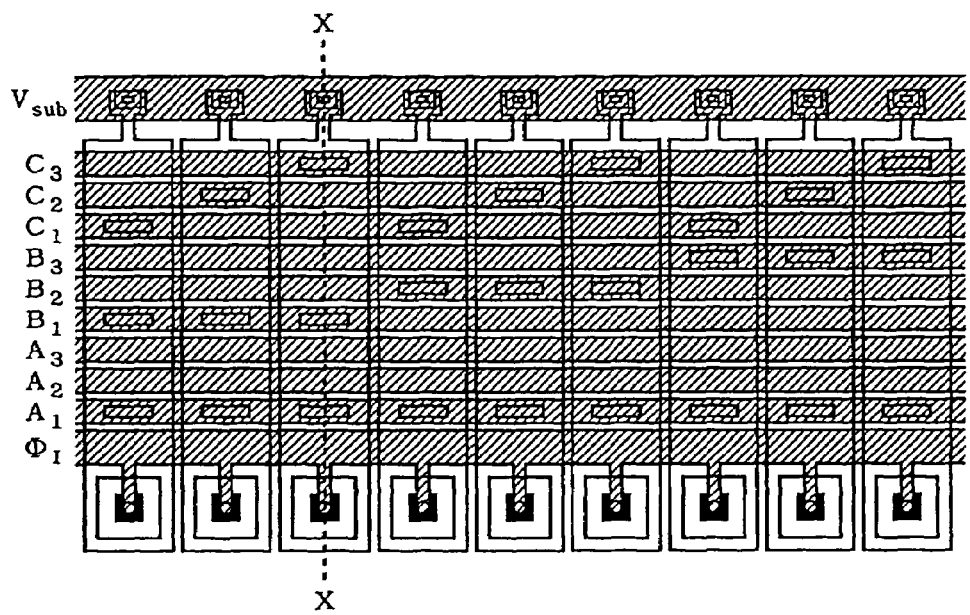
FIGS. 25A and 25B show a plan view and cross-sectional view of a device structure of the light-emitting element array in FIG. 24.
Figure 25B:
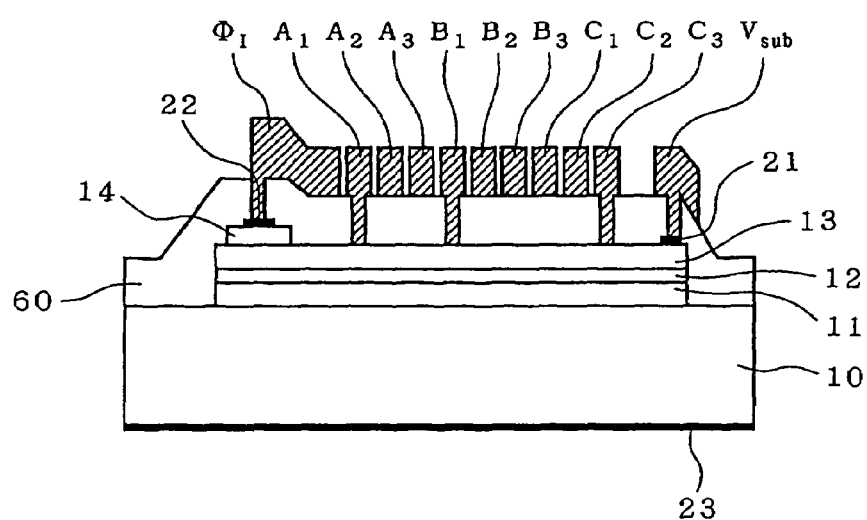

Referring to FIGS. 25A and 25B, there are shown a device structure of the light-emitting thyristor formed in a chip. FIG. 25A is a plan view and FIG. 25B is a cross-sectional view taken along an X—X line in FIG. 25A. The elements in the figures common to that in FIG. 3 are identified by the same reference numerals. It is noted that the resistor RK is not shown in FIGS. 25A and 25B. It is also appreciated that the signal lines A1–A3, B1–B3, and C1–C3 are contacted to the base layer 13 to form schottky barrier diodes SB.

In this light-emitting element array, a light-emitting thyristor is lighted up when all of the inputs of the AND gate 150 are in High-level and the φI line is in Low-level. Consequently, a plurality of light-emitting thyristor may be statically lighted up.

Embodiment 9

Figure 26:
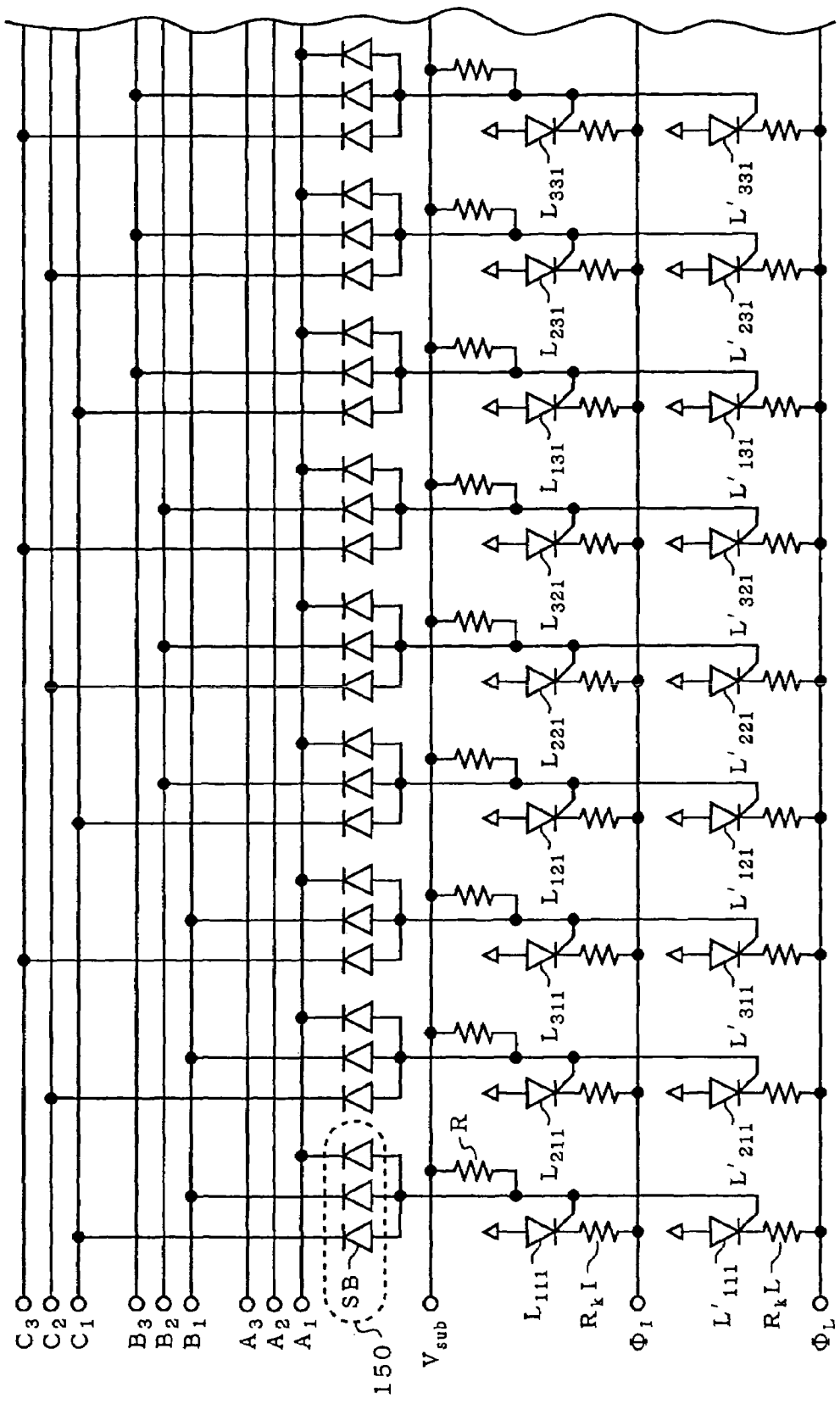
FIG. 26 shows a circuit diagram of a light-emitting element array of the ninth embodiment.

In the present embodiment, one row of light-emitting thyristors is further provided in the circuit of the embodiment 8 shown in FIG. 24. That is, a light-emitting thyristor array using a row of light-emitting elements L each provided with a three-input AND gate is provided as a memory for storing data, and a row of light-emitting thyristors L' is further provided. A circuit diagram thereof is shown in FIG. 26. A gate of each light-emitting thyristor L' is connected to a gate of a corresponding light-emitting thyristor L, and a cathode of each light-emitting thyristor L' is connected to a φL line via a resistor RKL.

In this structure, a light-emitting thyristor L connected to a φI line is used as a memory device to which a data is stored. A light-emitting thyristor L' is lighted up according to the data stored in the light-emitting thyristor L by driving the φL line to Low-level.

Figure 27:
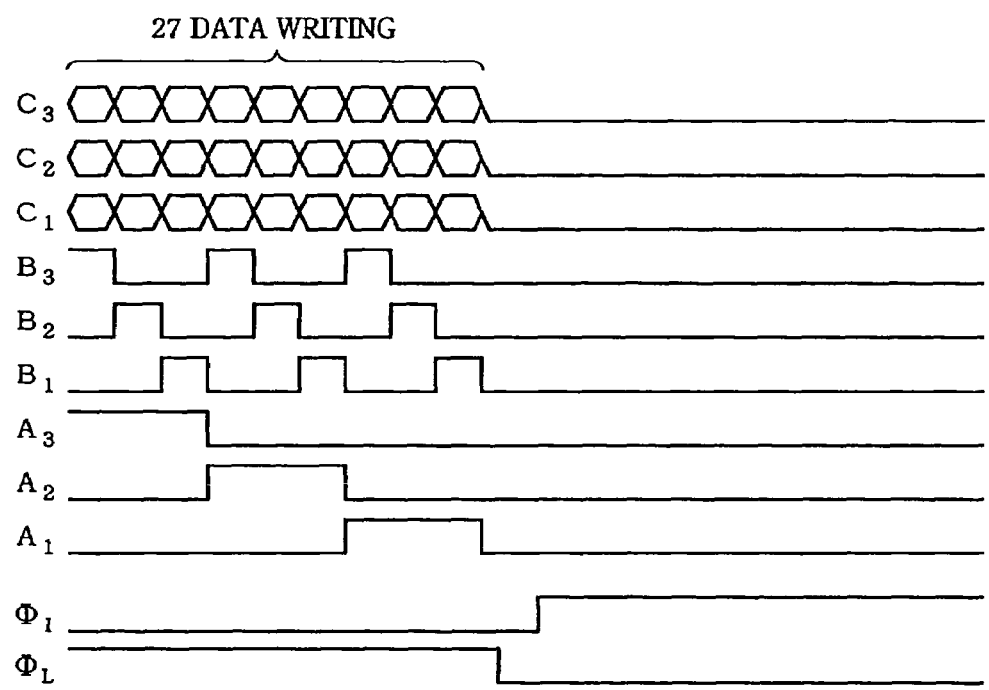
FIG. 27 shows timing waveforms for driving the light-emitting element array in FIG. 26.

An example of timing waveforms for driving the circuit in FIG. 26 is shown in FIG. 27. The case will now be illustrated in which 27 light-emitting thyristors L' are lighted up at the same time. After storing 27 data to light-emitting thyristors L connected to the φI line, any light-emitting thyristor L' is lighted up according to the data stored in the light-emitting thyristor L by driving the φL line to Low-level. Because the cathode of each light-emitting thyristor L' is directly connected to the φL line, a driver (not shown) for driving the φI line may be composed of a circuit which provide a current the amount thereof depends on the number of lighted-up thyristors.

Embodiment 10

Figure 28:
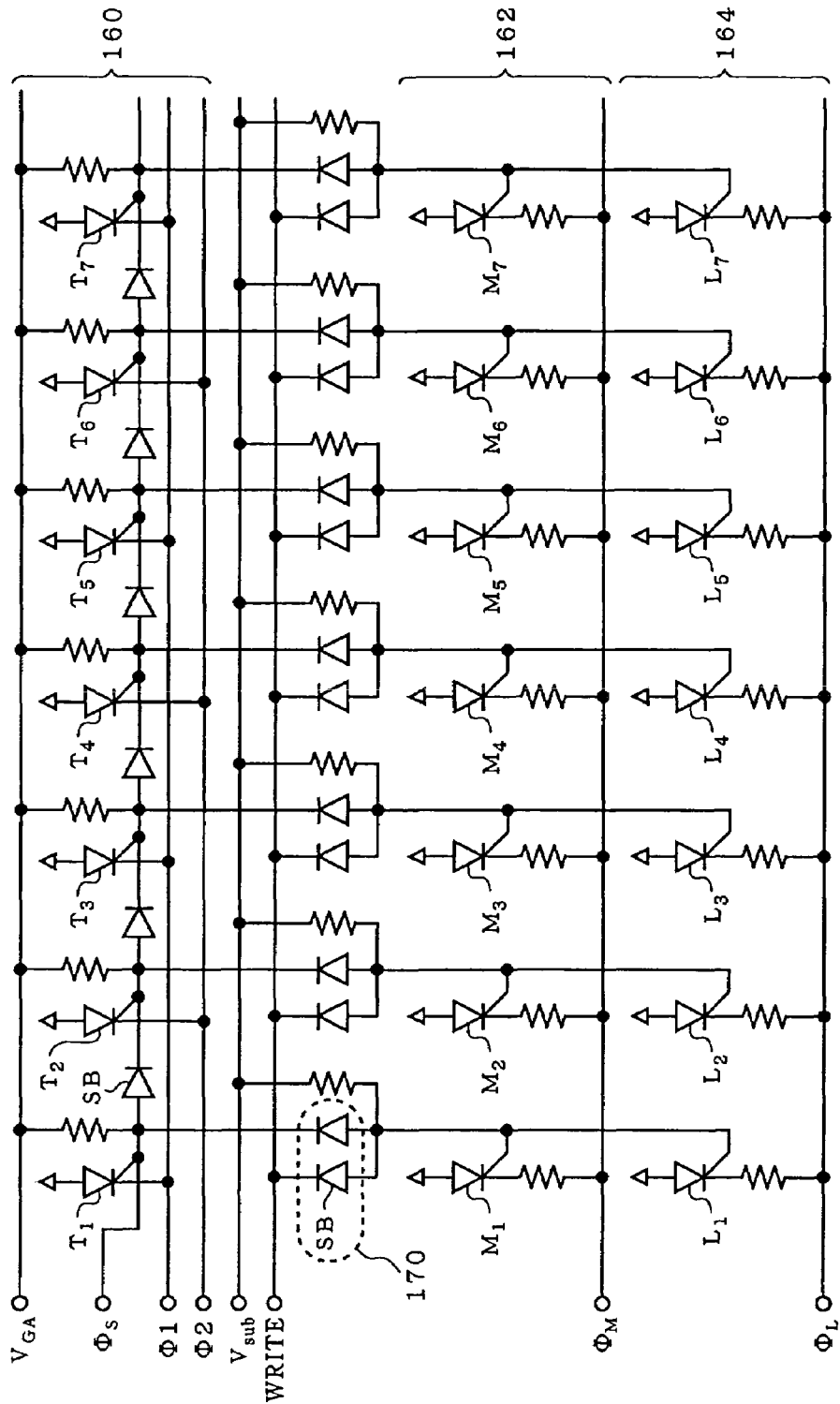
FIG. 28 shows a circuit diagram of a light-emitting element array of the tenth embodiment.

The present embodiment is directed to a combination of two-input AND gates and a self-scanning light-emitting element array. FIG. 28 shows a circuit diagram of the embodiment. The circuit comprises a shift portion 160 consisting of a row of light-emitting thyristors T (the adjacent thyristors are connected to each other by a schottky barrier diode SB), a memory portion 162 consisting of a row of light-emitting thyristors M for a memory, and a light-emitting portion 164 consisting of light-emitting thyristors L for lighting up. A gate of a thyristor M of the memory portion is connected to a two-input AND gate 170 structured by schottky barrier diodes, and input terminals of the AND gate are connected to a write line WRITE and a gate of thyristor T of the shift portion, respectively. A gate of a thyristor M of the memory portion is also connected to a corresponding thyristor L of the light-emitting portion.

A cathode of a thyristor of the memory portion is connected to a φM line via a resistor, and a cathode of a thyristor of the light-emitting portion is connected to a φL line via a resistor.

The structure of the shift portion is the same as that of the self-scanning light-emitting element array shown in FIG. 6.

In the above-described structure, the WRITE line is driven to High-level in order to turn on a thyristor(s) M of the memory portion designated by the shift portion 160, or the WRITE line is driven to Low-level in order not to turn on the thyristor M. This information for the WRITE line is stored in the thyristors M of the memory portion. A thyristor L of the light-emitting portion is lighted up based on the information when the light-emitting line φL is driven to Low-level.

Using the above-described structure, a plurality of light-emitting data are stored in the thyristors M of the memory portion and then all of the thyristors L of the light-emitting portion are lighted up at the same time, thereby improving the amount of light to be integrated.

Figure 29:
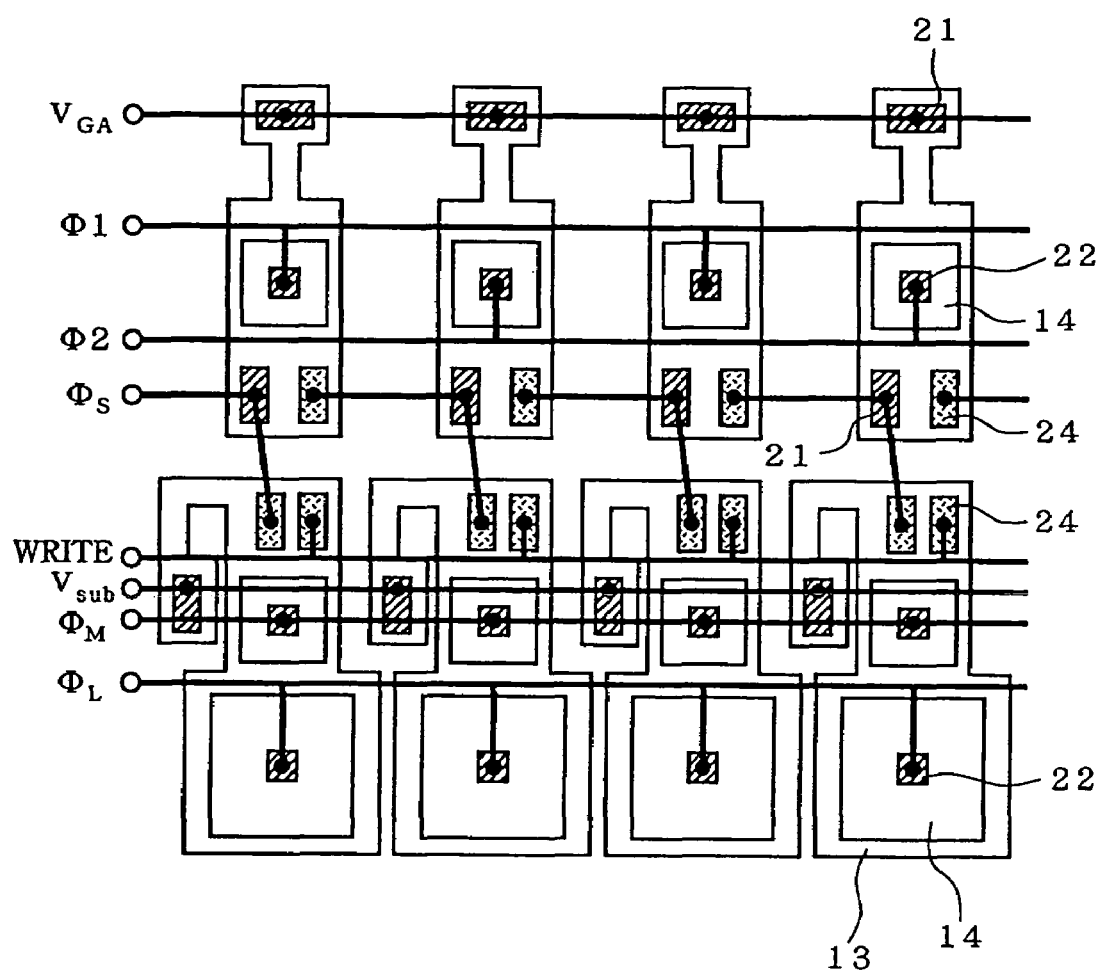
FIG. 29 shows a plan view of a device structure of a self-scanning light-emitting element array in FIG. 28.

An example of a device structure of the circuit of FIG. 28 is shown in FIG. 29. In the figure, resistors between the lines φM, φL and cathodes of the light-emitting thyristors M, T are omitted, and the components that are the same as in FIG. 3 are identified by the same reference numerals. Reference numeral 24 designates a schottky electrode.

Figure 30:
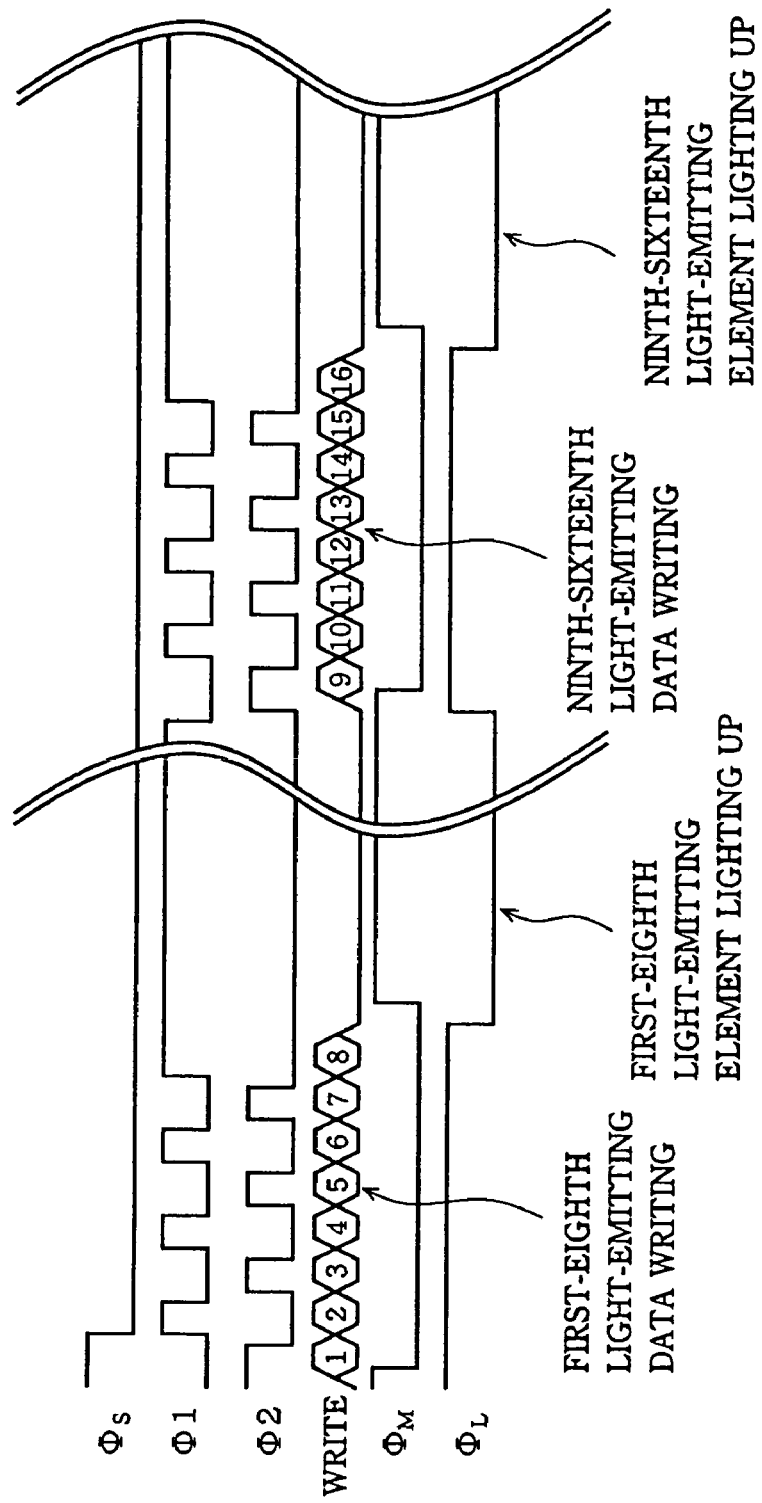
FIG. 30 shows driving pulses for the self-scanning light-emitting element array in FIG. 28.

An example of driving pulses for lighting up eight light-emitting thyristors as one group is illustrated in FIG. 30. In order to turn on the thyristors M of the memory portion designated by the shift portion 160, the WRITE terminal should be driven to High-level. On the other hand, the WRITE terminal should be driven to Low-level in order not to turn on the thyristors M. After storing a data set for the first-eighth light-emitting elements is stored in the thyristors M1–M8 of the memory portion, the WRITE terminal and the φL line are both driven to Low-level, thereby lighting up the ones in the thyristors L1–L8 designated by the data inputted to the WRITE terminal. Then, the memory portion is erased by driving the φM line to High-level. After a predetermined turned-on time has lapsed, the φL line is driven to High-level to light out the thyristors of the light-emitting portion, and then a data set for next group of ninth—sixteenth, i.e., eight light-emitting elements is read from the WRITE terminal.

In this manner, eight light-emitting elements are deemed as one group, and the φI line is driven to Low-level every group to light up them. Using this driving method, the number of thyristors that are lighted up at the same time may be changed by varying the driving waveforms even if the structure of a chip is the same.

INDUSTRIAL APPLICABILITY

According to the present invention, a light-emitting element including a light-emitting thyristor and a schottky barrier diode may be realized. Using such a light-emitting element, a self-scanning light-emitting element array operating at 3.0V, and furthermore a light-emitting element and a light-emitting element array each having a logical function may be implemented. These light-emitting element and light-emitting element array have applicabilities for various equipments.

The invention claimed is:
1. A light-emitting element comprising:
at least one light-emitting thyristor fabricated by a PNPN-structure in which a first conductivity-type semiconductor layer, a second conductivity-type semiconductor layer, a first conductivity-type semiconductor layer, and a second conductivity-type semiconductor layer are stacked in this order on a first conductivity-type semiconductor substrate, and including a gate electrode ohmically contacted to a gate layer of the PNPN-structure; and
at least one schottky barrier diode structured by a schottky junction between the gate layer and at least one metal terminal.
2. The light-emitting element according to claim 1, wherein the metal terminal is composed of a metal selected from a group consisting of Au, Al, Pt, Ti, Mo, W, WSi, and TaSi.
3. The light-emitting element according to claim 1, wherein the PNPN-structure is composed of AlGaAs and the metal terminal is formed by an Al wiring.
4. A light-emitting element comprising:
at least one light-emitting thyristor fabricated by a PNPN-structure in which a first conductivity-type semiconductor layer, a second conductivity-type semiconductor layer, a first conductivity-type semiconductor layer, and a second conductivity-type semiconductor layer are stacked in this order on a first conductivity-type semiconductor substrate; and
a logic circuit for controlling the light-emitting state of the light-emitting thyristor, comprising at least two schottky barrier diodes, each diode formed on any of the semiconductor layers of the PNPN-structure.
5. The light-emitting element according to claim 4, wherein the logic circuit is an OR gate consisting of a diode-diode logic.
6. The light-emitting element according to claim 4, wherein the logic circuit is an AND gate consisting of a diode-diode logic.
7. The light-emitting element according to claim 4, wherein the logic circuit is a set-reset flip-flop.

* * * * *